(12) United States Patent
Dangelmaier et al.

(10) Patent No.: US 7,766,560 B2
(45) Date of Patent: Aug. 3, 2010

(54) CONNECTOR MODULE AND METHOD OF MANUFACTURING THE SAME

(75) Inventors: Jochen Dangelmaier, Beratzhausen (DE); Stefan Paulus, Zeitlarn (DE); Cyrus Ghahremani, Regensburg (DE); Uwe Schindler, Reichenbach (DE); Rudolf Siegfried Lehner, Laaber (DE)

(73) Assignee: Infineon Technologies AG, Munich (DE)

( * ) Notice: Subject to any disclaimer, the term of this patent is extended or adjusted under 35 U.S.C. 154(b) by 733 days.

(21) Appl. No.: 11/622,503

(22) Filed: Jan. 12, 2007

(65) Prior Publication Data

US 2008/0160828 A1    Jul. 3, 2008

(30) Foreign Application Priority Data

Dec. 28, 2006   (DE) .................. 10 2006 061 722

(51) Int. Cl.
   *G02B 6/36*   (2006.01)
(52) U.S. Cl. ....................................... 385/92
(58) Field of Classification Search ............. 385/88–92
   See application file for complete search history.

(56) References Cited

U.S. PATENT DOCUMENTS

| | | | |
|---|---|---|---|
| 5,960,141 A | 9/1999 | Sasaki et al. | |
| 6,341,898 B1* | 1/2002 | Matsushita | ............... 385/88 |
| 6,483,960 B2* | 11/2002 | Schroedinger | ............... 385/14 |
| 6,517,258 B1* | 2/2003 | Keska et al. | ............... 385/92 |
| 6,572,280 B2 | 6/2003 | Hurt et al. | |
| 7,048,450 B2* | 5/2006 | Beer et al. | ............... 385/88 |
| 7,068,892 B1* | 6/2006 | Lu et al. | ............... 385/52 |
| 7,101,091 B2* | 9/2006 | Golwalkar et al. | ............ 385/89 |
| 7,160,035 B2* | 1/2007 | Miyamae et al. | ............... 385/88 |
| 7,160,039 B2* | 1/2007 | Hargis et al. | ................. 385/93 |
| 7,226,216 B2 | 6/2007 | Hurt et al. | |
| 7,435,014 B2* | 10/2008 | Rosenberg et al. | ............ 385/92 |
| 2004/0247256 A1* | 12/2004 | Hurt et al. | .................. 385/88 |
| 2005/0139946 A1* | 6/2005 | Hung et al. | .................. 257/433 |

FOREIGN PATENT DOCUMENTS

| | | |
|---|---|---|
| DE | 10001875 | 8/2001 |
| DE | 10319900 | 11/2004 |
| EP | 0182920 | 4/1986 |

OTHER PUBLICATIONS

Office Action from German Patent Application 102006061722.3-51 dated Aug. 13, 2007.

* cited by examiner

*Primary Examiner*—Neil Abrams
(74) *Attorney, Agent, or Firm*—Banner & Witcoff, Ltd.

(57) ABSTRACT

A connector module (31, 71) has a base body (21) having a first contact (27) for electrically contacting an optoelectronic module (72) to be positioned into a depression (36) in the base body, a second contact (25) for electronically contacting a board, and a conductive trace (23) for electrically connecting the first (27) and second (25) contacts on a surface of the base body (21), and a molded part (33), the molded part (33) being cast onto the base body (21) across a first part of the surface, and the base body (21) and/or the molded part (33) defining a through-opening (13, 19, 37) for introducing a fiber (73). The base body (21) and the molded part (33) form two jaws for gripping the fiber (73).

44 Claims, 20 Drawing Sheets

CONNECTOR MODULE AND METHOD OF MANUFACTURING THE SAME

CROSS-REFERENCE TO RELATED APPLICATION

This application claims priority from German Patent Application No. 10 2006 061 722.3, which was filed on Dec. 28, 2006, and is incorporated herein by reference in its entirety.

TECHNICAL FIELD

The present invention relates to a connector module and to a method of manufacturing same.

BACKGROUND

In electronic devices, such as mobile phones, hand-held computers or PDAs (personal digital assistants), data transmission may be implementable between a board having, for example, a display mounted thereon, and a board having, e.g., a keyboard and a CPU (central processing unit) arranged thereon. This data transmission is effected, for example, via an optical fiber extending through a hinge by means of which the two boards are mechanically connected to one another. For data transmission, an optical transmitter is mounted on the board associated with the keyboard, the transmitter coupling light into the optical fiber, while an optical receiver which converts an optical signal emerging from the fiber to an electrical signal is mounted on the board which has the display arranged thereon. The electrical signal is received by the display, is evaluated and, subsequently, an appropriate content is presented on the display.

Due to large numbers of pieces of such cost-sensitive devices, such as mobile phones or PDAs, in which optical data transmission is performed from board to board, connector modules for optical data transmission are faced with a demand for low manufacturing cost and small footprint.

SUMMARY

A connector module in accordance with an embodiment may comprise a base body having a first contact, a second contact, and a conductive trace electrically connecting the first and second contacts, on a surface of the base body, and a molded part, the molded part being cast onto the base body across part of the surface, and the base body and/or the molded part defining a fiber introduction opening.

BRIEF DESCRIPTION OF THE DRAWINGS

Preferred embodiments will be explained below in more detail with reference to the accompanying figures, wherein.

DETAILED DESCRIPTION

With reference to FIGS. 1a-6b, a description will initially be given of embodiments of a connector module in accordance with a first configuration which comprises a base body having contacts and electrical connections in between on its surface, and a molded part partly covering the electrical connections, so that the ease of use of the connector module is increased, a through-hole for a fiber being provided which opens for an optoelectronic device at a contact area of the base body.

With reference to FIGS. 1a-2e, a description will initially be given of the base body, which in this example is, by way of example, an injection-molded part 11.

Figure 1A:
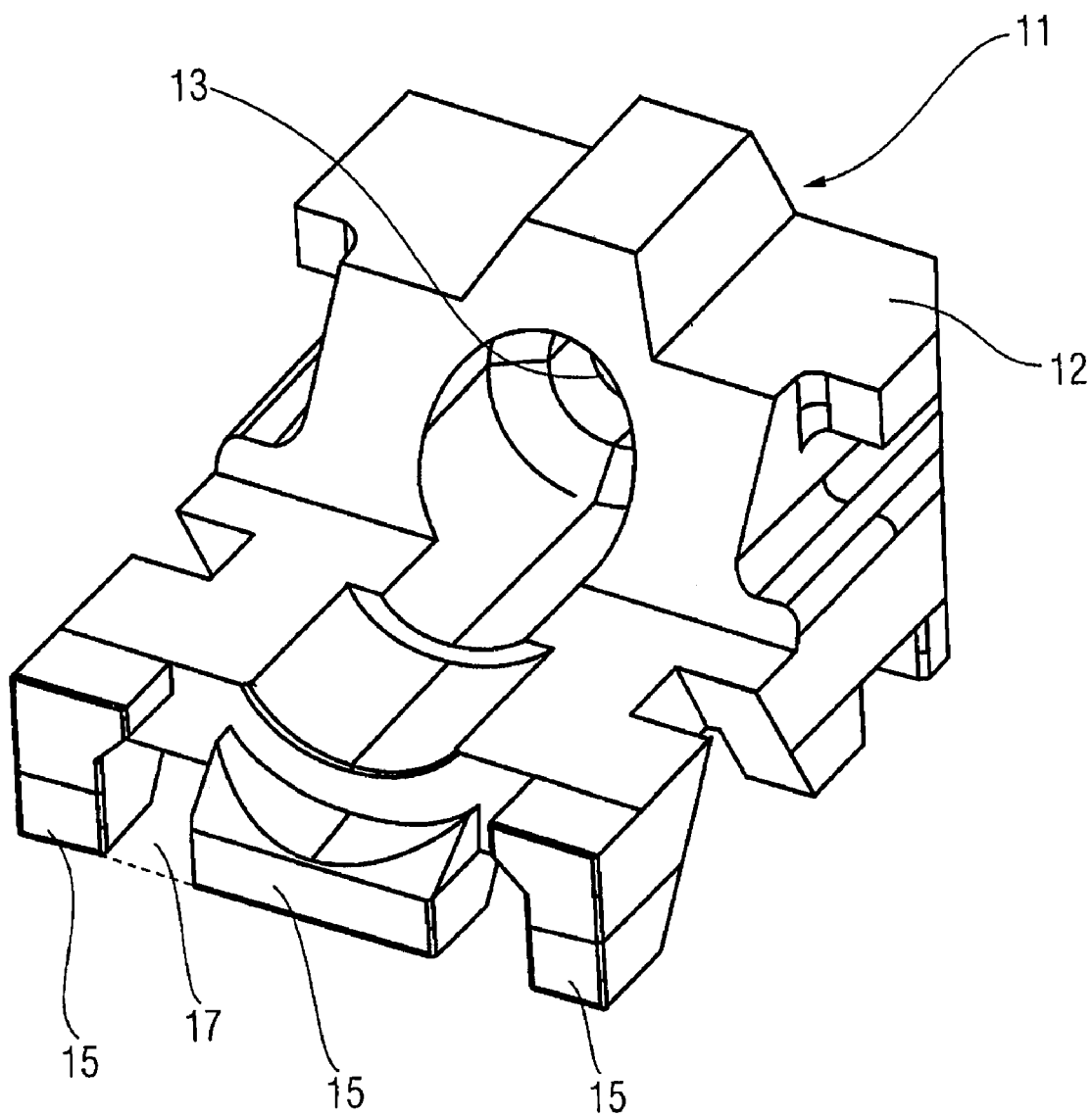
FIG. 1A is a plan view from above, at an angle, of an injection-molded part serving to manufacture a base body within a connector module in accordance with a first embodiment.

FIG. 1A depicts the injection-molded part 11. It comprises a body 12, a fiber opening 13, and a plurality of projections, or latches, or tabs, 15. Trenches 17 are formed between the latches 15, serving to form a basin for the molding material during casting of a molding material, or during a pre-molding step, which will be explained below. When casting a molding material, latches 15 and/or the projecting portions thus act as dams, so that the molding material will, during casting, collect in the depressions thus formed, and will prevent the molding material from deliquescing. Thus, the projecting portions enable the molding material to be cast such that the molding material continuously extends, on a top side or a bottom side of the injection-molded part, from one side of the bottom side to a side opposite the former side.

Fiber opening 13 serves to receive and/or hold a ferrule, in particular a mini-ferrule, a POF (plastic optical fiber), or a glass fiber, the fiber and/or the ferrule being centered, through fiber opening 13 within injection-molded part 11, against an optical axis of a connector module thus produced. Thus, during reception and/or positioning of a fiber, not shown here, within the first injection-molded article, or injection-molded part 11, the tolerances of the arrangement and/or of the alignment of the fiber toward an optoelectronic module, which in a subsequent process step will be mounted on a connector module fabricated from the injection-molded part 11, are reduced, and at the same time, an optical absorption in a transmission of the data by means of a light beam propagating between the optoelectronic module and a fiber end is minimized.

Figure 1B:
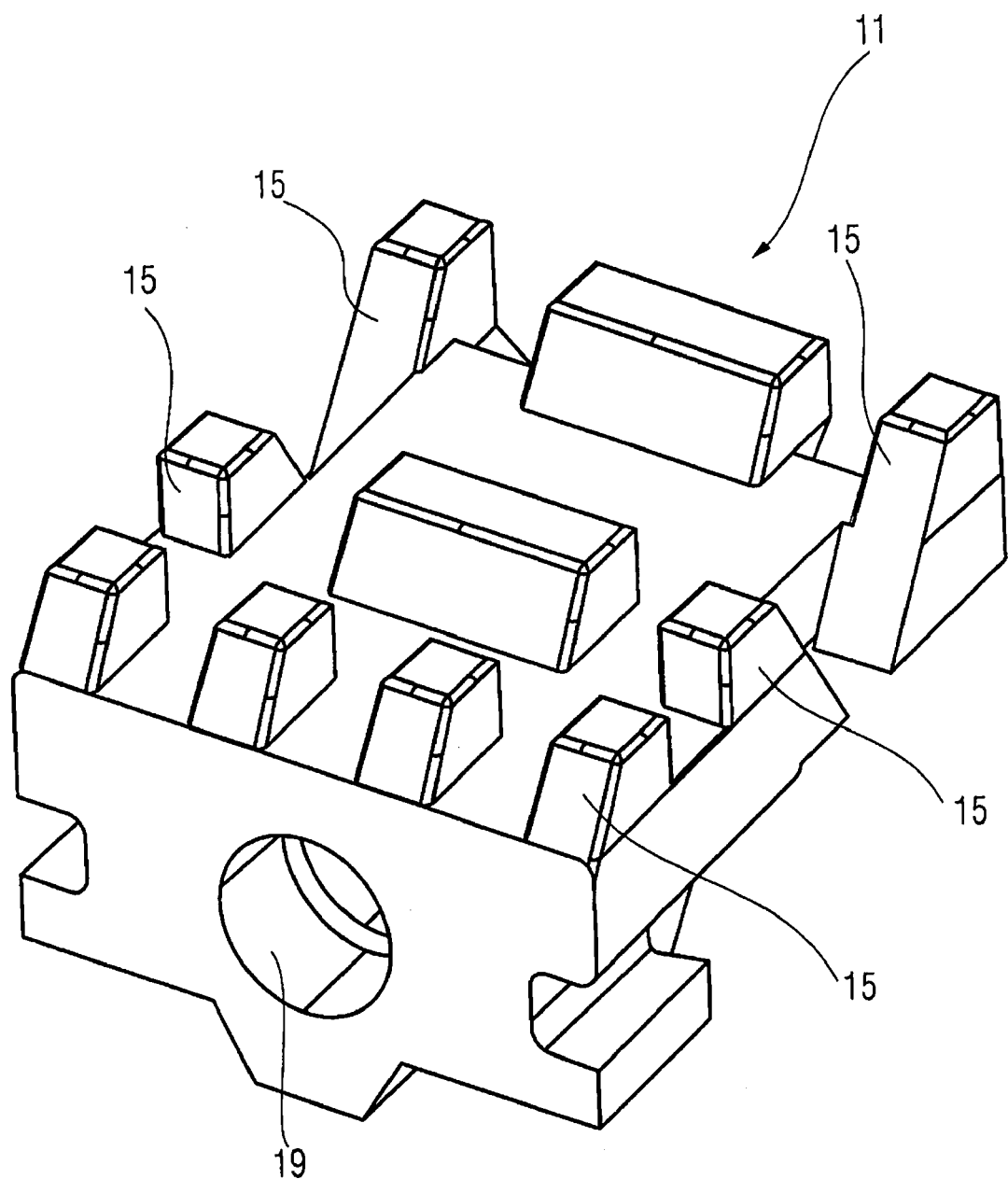
FIG. 1B is a plan view from below, at an angle, of the injection-molded part depicted in FIG. 1A.

FIG. 1B shows plan view from below, at an angle, of the injection-molded part 11 depicted in FIG. 1A. It is clear from FIG. 1B that the injection-molded part 11 comprises, at a surface facing away from the fiber opening 13, a cavity 19 for an optoelectronic module. Cavity 19 for the optoelectronic module exhibits, in the injection-molded part 11 shown in FIG. 1B, a round shape, but the shape of the hole, or cavity, could also be square or take on any other form. One possibility is to configure cavity 19 to be rectangular. In particular, the shape of cavity 19 may be adjusted to a shape of the optoelectronic module arranged within the cavity. This might result in a low positional tolerance regarding the optoelectronic module to be mounted, or positioned, within the cavity. A surface, depicted in FIG. 1B, at which cavity 19 opens, is also referred to as the front side, or chip assembly end.

The latches 15 specify a contact configuration, or a footprint, since, as will be explained below, solder contacts are formed on their surfaces which serve to connect a connector module fabricated from the injection-molded part 11 to a board. Such a configuration of the solder contacts is characterized by a high level of mechanical stability.

Figure 2A:
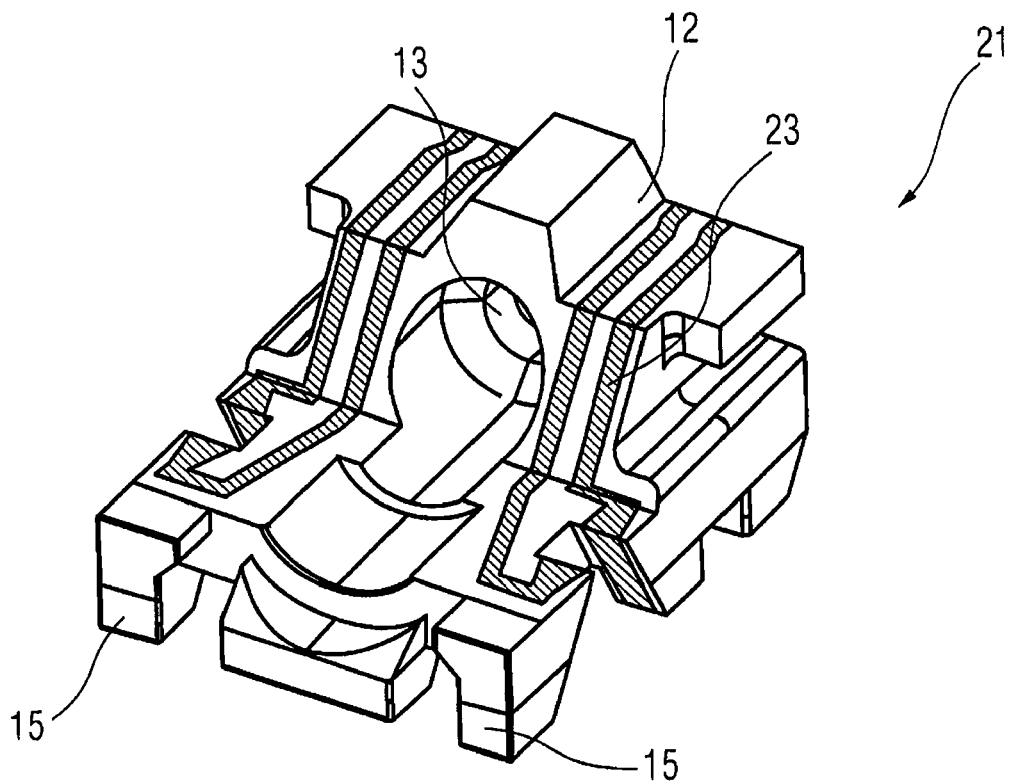
FIG. 2A is a plan view from above, at an angle, of the base body used for manufacturing a connector module in accordance with a first embodiment.

FIG. 2A depicts a plan view from above, at an angle, of base body 21 as results after a depositing step for depositing, e.g., conductive traces and contacts onto injection-molded part 11. Concerning base body 21, for example, conductive traces 23 were deposited onto body 12. Appropriate process steps for preparing metallization, for example activating the surface of body 12 by means of a laser, are performed, whereupon the activated areas are cleaned. Cleaning is effected, for example, by means of so-called ultrasonic cleaning, wherein particles of pollution are detached from the surface and removed. In the activated areas, conductive traces 23 are subsequently formed by selectively metallizing the surface.

Figure 2B:
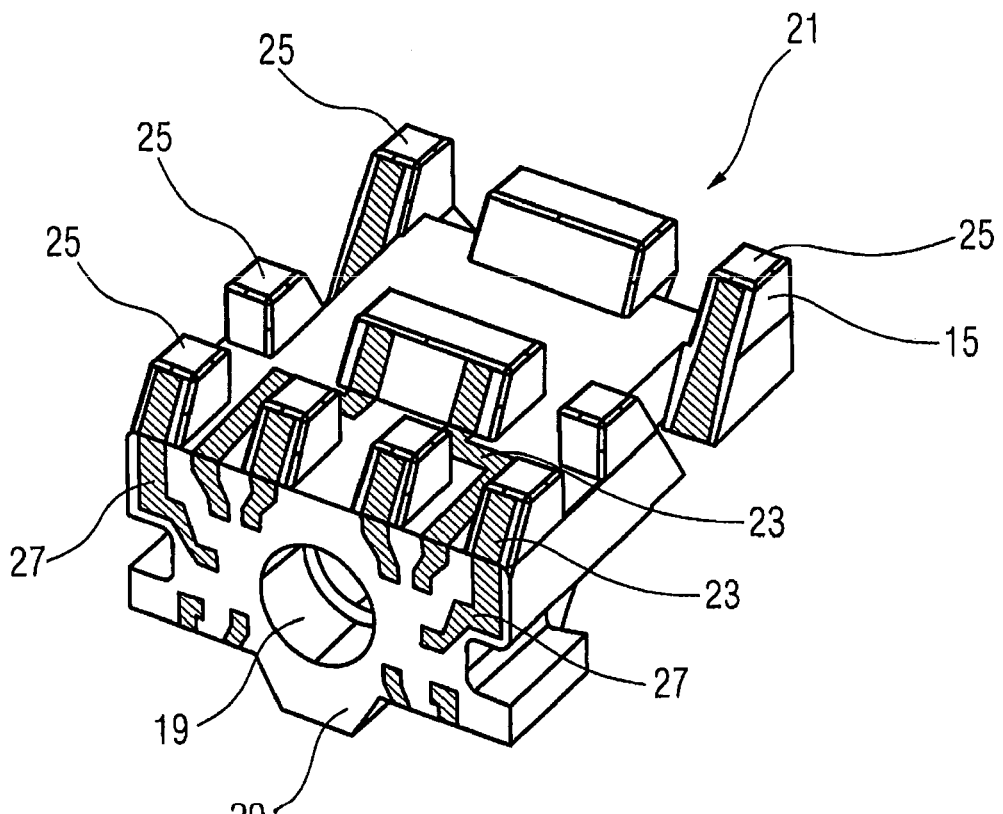
FIG. 2B is a plan view from below, at an angle, of the base body depicted in FIG. 2A.

FIG. 2B shows a plan view from below of base body 21. In the plan view, one can see board contacts 25 which have been formed on the top surfaces of latches 15 during the activating and metallizing steps. At the same time, optomodule contacts 27 are formed on a front side 29 of base body 21 which are employed to fix an optoelectronic module to base body 21 in a subsequent process step, and simultaneously serve to establish an electrical connection between the contacts at the optoelectronic module and board contacts 25 via conductive traces 23. By means of board contacts 25, which are electrically conducting, the connector module in accordance with a first embodiment which is to be manufactured is fixed, as will be explained in more detail later on, to an electrical contact on the board, and an electrical connection to further circuit elements on the board is generated. Conductive traces 23, board contacts 25 and optomodule contacts 27 may be configured, e.g., on the basis of gold or nickel, for example of copper-nickel-gold.

Since the latches, or projections, or tabs, 15 are characterized by a high level of mechanical stability, board contacts 25 on the assembly side also have a high level of mechanical stability, so that a rigid, or mechanically stable form of the solder surface thus configured results at the bottom of base body 21. In addition, mechanical stability of the projections, or tabs, is advantageous for ensuring, in a subsequent pre-molding step, a high level of mechanical stability of the base body 21 against a molding material to be deposited.

Figure 2C:
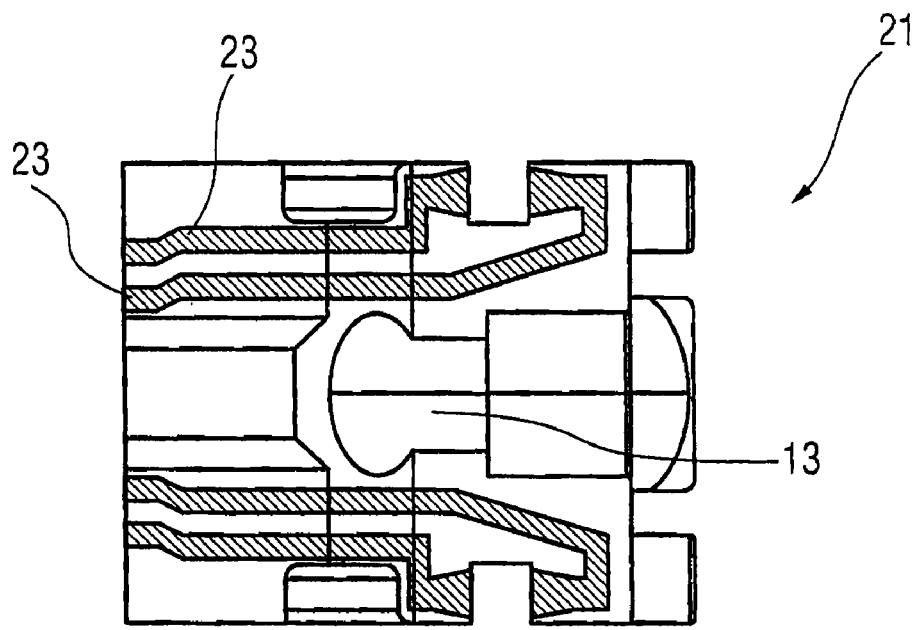
FIG. 2C is a front view from above of the base body depicted in FIGS. 2A-B.
Figure 2D:
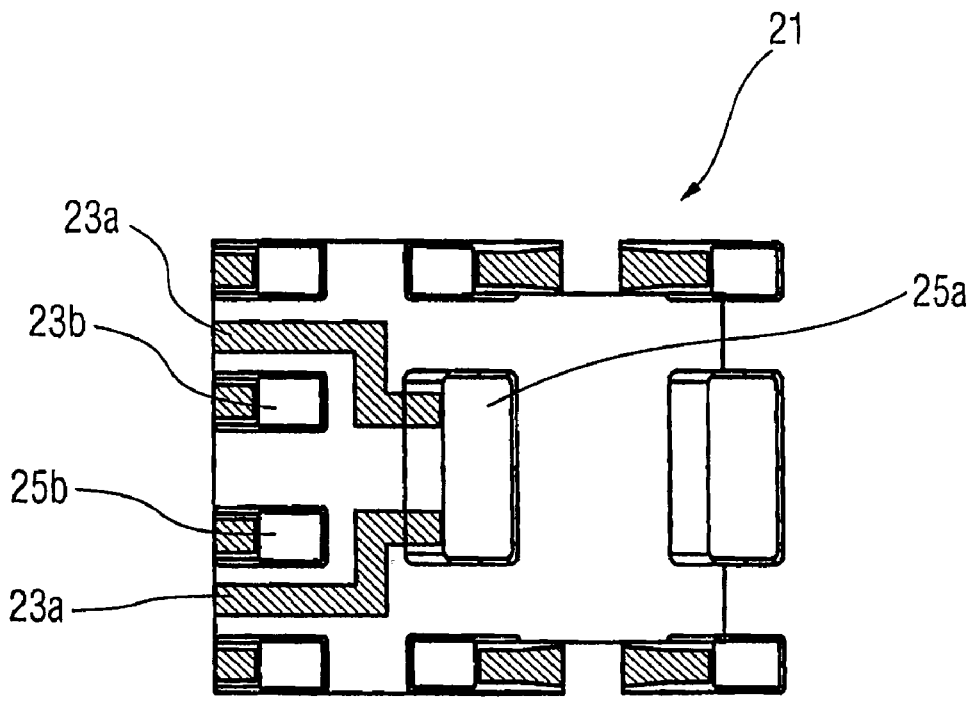
FIG. 2D is a front view from below of the base body depicted in FIG. 2C.

FIG. 2C depicts a front view from above of base body 21, while in FIG. 2D a front view from below of base body 21 is shown. FIG. 2D shows shielding lines 23a extending to a ground terminal 25a. At ground terminal 25a, a ground potential may be set via a contact, not shown here, on a board if the base body 21 is mechanically and electrically connected, at ground terminal 25a, to the contact on the board. Shielding lines 23a enable shielding of differentially routed high-frequency lines 25b extending along the bottom surface of base body 21. Differentially routed high-frequency lines 25b will be connected, in subsequent process steps which have not yet been explained, to, e.g., a data line on the board, so that data transmission to the optoelectronic module may be effected via the differentially routed high-frequency lines 25b.

By means of the arrangement, shown in FIG. 2D, of the differentially routed HF lines 25b having small lengths, and of shielding lines 23a which here extend in parallel, for example, electromagnetic sensitivity and electromagnetic radiation behavior of a connector module manufactured from base body 21 is reduced or optimized.

Figure 2E:
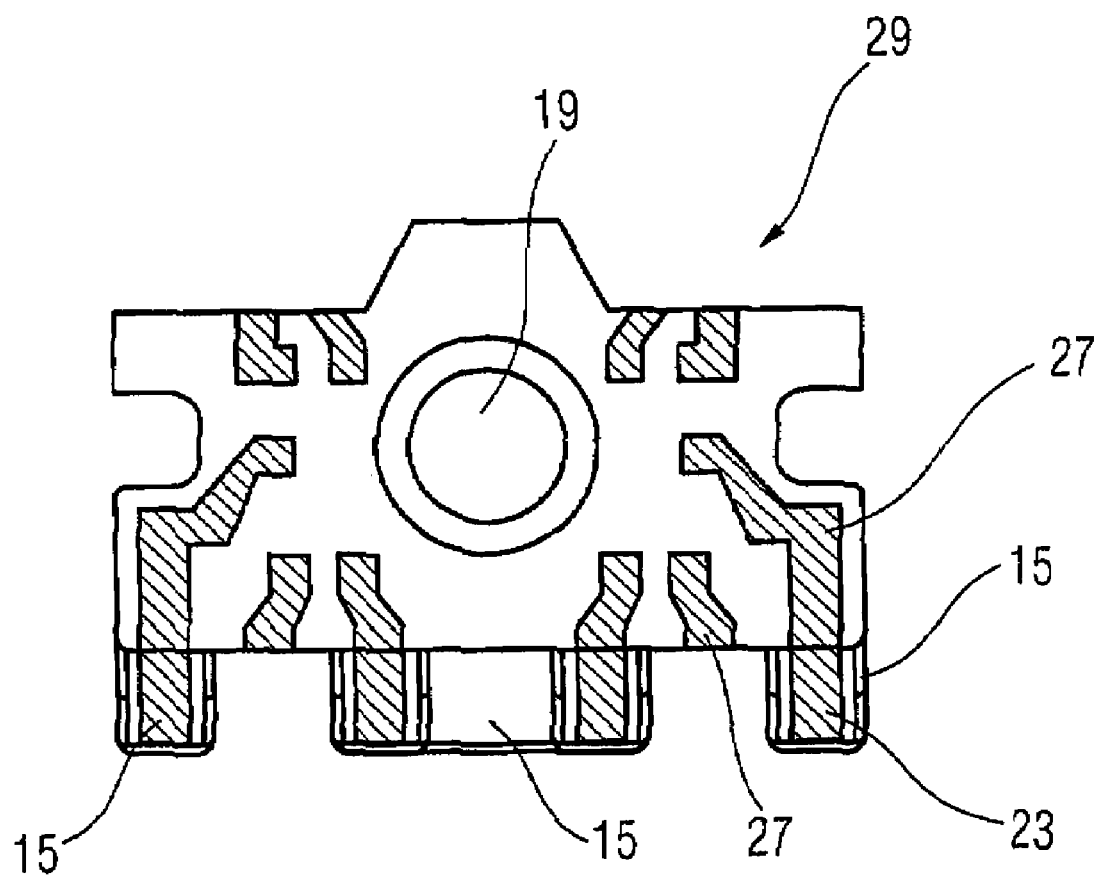
FIG. 2E is a front view of a contact area on the base body depicted on FIGS. 2A-D.

FIG. 2E shows a front view of base body 21, in which only the front face 29, or contact area 29, and projections or tabs 15 with conductive traces 23 can be seen. Optomodule contacts 27 specify a contact configuration for the optoelectronic module to be fixed within cavity 19.

Figure 3A:
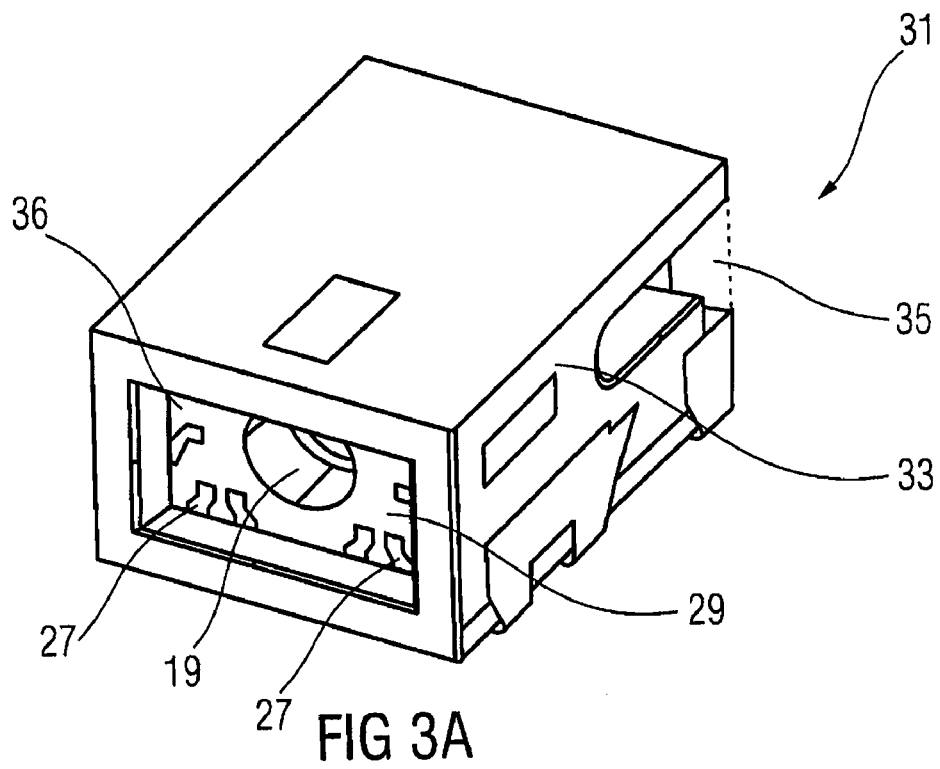
FIG. 3A is a plan view from above, at an angle, of the connector module in accordance with a first embodiment.

In FIG. 3A there is a connector module 31 which may be manufactured from base body 21 in that a molding material is cast across base body 21, so that a molded part 33 will form. In the process, base body 21 is cast such that a spring slit 35 will form within connector module 31, and a depression 36 will form at front face 29 of base body 21. Spring slit 35 serves to enable connector module 31 to be spread, so that a ferrule or glass fiber may be inserted into connector module 31 in a spread state of the connector module, and is fixed, or fixed, at connector module 31 in a non-spread state of connector module 31. Depression 36 on front face 29 of base body 21 facilitates arranging, or positioning, the optoelectronic module at connector module 31.

Figure 3B:
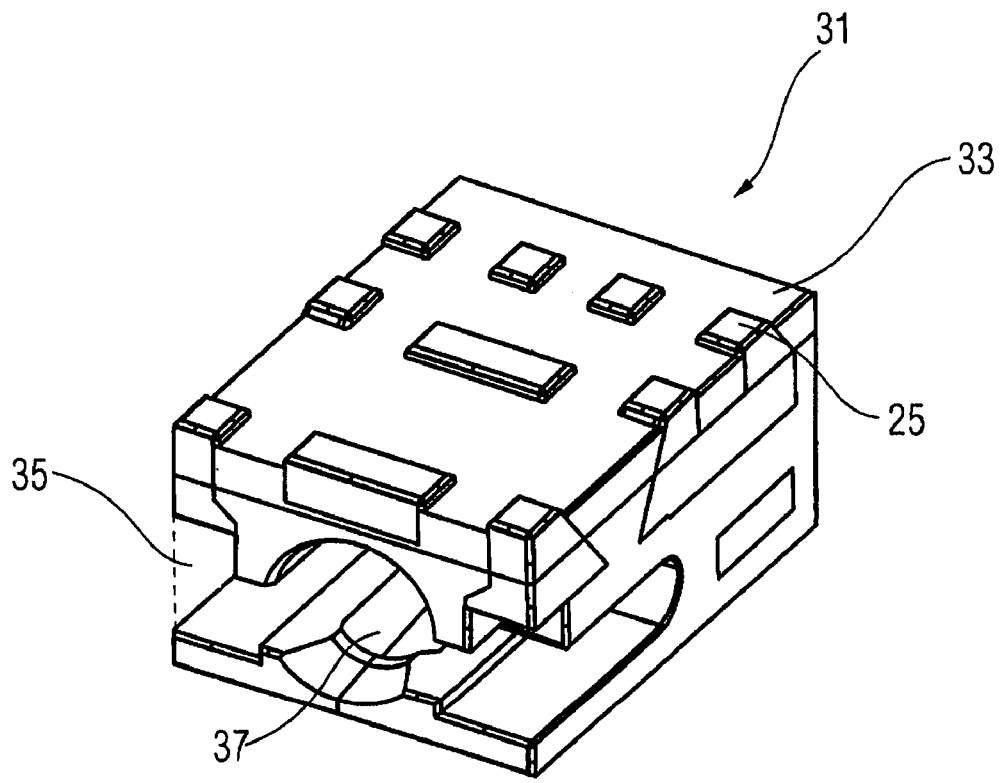
FIG. 3B is a plan view from below, at an angle, of the connector module in accordance with a first embodiment.

FIG. 3B shows a plan view from below of connector module 31 in accordance with a first embodiment, this perspective depicting a fiber hole 37 which extends, within the molded part 33, from a side of the body 21 which is opposite the front side to the fiber opening 13, not shown, within base body 21.

The fiber is fixed, or positioned, to connector module 31 in such a manner, for example, that a fiber is inserted through the fiber hole 37 up to the fiber opening 13 within injection-molded part 11, and that a fiber end provided with a ferrule, or the fiber end itself, is positioned and fixed directly within fiber opening 13.

What is advantageous about the connector module 31 thus configured is that the molded part 33 partly covers the conductive traces 23. In other words, molding the molded part 33 and/or performing the second molding step, or the post-molding step, causes the metallization on base body 21 to be at least partially covered, and/or conductive traces 23 on base body 21 to be at least partially embedded between molded part 33 and base body 21. In addition to conductive traces 23, board contacts 25 or optomodule contacts 27 may also be at least partially covered by molded part 33.

Thus, a subsequent assembly step, wherein connector module 31 in accordance with a first embodiment is mounted on a board, is easier to implement, since a probability that a solder material bleeding during the assembly may inadvertently make contact with the exposed conductive traces and may even lead to the connector module 31 being short-circuited is reduced. Here, the conductive traces may even be covered such that connector module 31 exhibits no exposed, or open, conductive traces, except within the plug area, or within the area of the board contacts 25. Therefore, it is easier to mount connector module 31 onto a board, it being possible to fabricate the mechanical and electrical connection to the board with increased reliability.

Figure 3C:
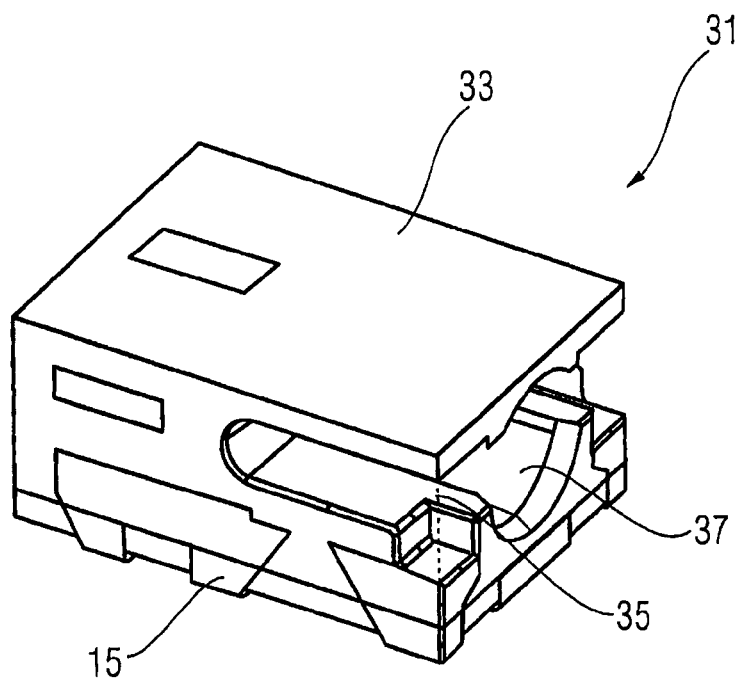
FIG. 3C is a plan view from above, at an angle, of one side of the connector module in accordance with a first embodiment.
Figure 4:
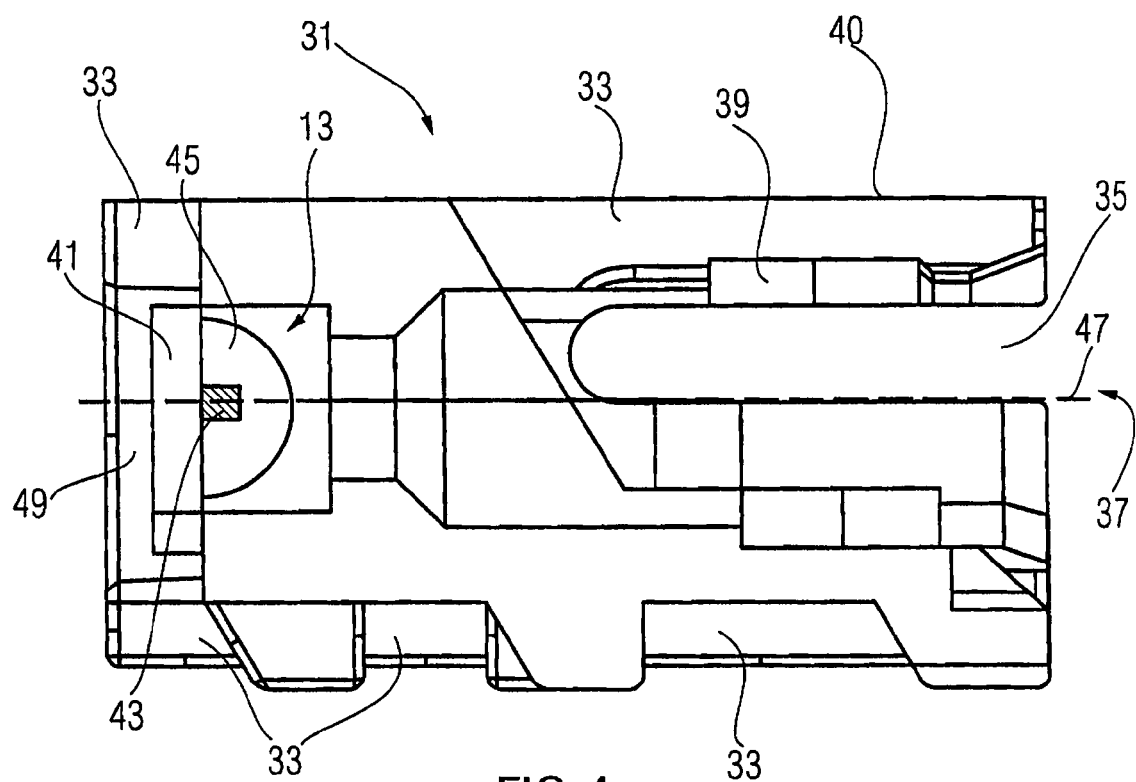
FIG. 4 is a semi-transparent sectional side view of the connector module in accordance with a first embodiment, comprising an optoelectronic module.

FIG. 4 shows a semi-transparent sectional side view of connector module 31 of FIGS. 3a-3c, a flaring 39 of the fiber hole 37 being visible in the area of the spring slit 35, the flaring serving to prevent the spring lip, formed by molded part 33, from coming to lie on an inserted ferrule in the area of flaring 39, and connector module 31 having the optoelectronic module arranged therein which consists of a signal-processing chip 41, a chip 43 comprising an optically active area, and a transparent globe top 45. The chip 43 comprising the optically active area is fixed on signal-processing chip 41, or ASIC (application-specific integrated circuit) 41 on a surface facing the spring slit 35, it being possible to perform the securing by means of a conductive adhesive, for example.

The globe top (=molding material) is also arranged on that surface of the signal-processing chip 41 which is facing the spring slit 35, so that chip 43 comprising the optically active area is fully covered by signal-processing chip 41 and globe top 45.

Chip 43 may be arranged, in a centered manner, opposite an optical axis 47 of fiber hole 37 and/or of fiber opening 13, so that optical axis 47 penetrates the optically active area on chip 43. The optically active area may be a photosensitive area on chip 43 or may be an area where chip 43 radiates, or emits, a light beam. Optical axis 47 extends along a center, or along a symmetry line, of fiber opening 13.

Globe top 45 is optically transparent, for example, so as to enable propagation of the light beam from an optical fiber, not shown here, inserted into fiber hole 37 to the optically active area of chip 43. In addition, the exterior surface of globe top 45 may be formed such that it increases a collimating action of the fiber light beam on chip 43 and/or increases a collimating and/or the fraction of the light reflected off chip 43 and entering into the fiber, so as thus to contribute to the optical coupling of the optoelectronic module to the fiber. A further molding mass 49 serves to seal the depression 36 within connector module 31, it being possible to cast the molding mass 49 into the depression such that a surface of the further molding mass 49 which is facing away from signal-processing chip 41 is flush with a surface of connector module 31. As may be seen from FIG. 4, in connector module 31, spring slit 35 may be configured eccentrically and with such a long length that a fiber to be inserted will rest on connector module 31, or will touch connector module 31, at its end over a long length.

What is particularly advantageous about connector module 31 depicted in FIG. 4 is that a single MID pre-mold cavity package may be employed both for an optical transmitter and for an optical receiver in that only an arrangement of the optomodule contacts 27 is selected, on the front face 29 on the base body 21 shown in FIG. 2B, in such a manner, in each case, that the connector module is designed for a transmitter or for a receiver, and that at the same time chip 43 comprising the optically active area is selected in accordance with the mode of operation desired. The arrangement and/or structure of optomodule contacts 27 may be defined in a simple manner when laser-structuring body 12, for the respective type of optoelectronic module to be fixed. The MID base body thus produced may therefore be employed for various circuit configurations and/or optoelectronic modules, an adjustment to the arrangement of the contacts on the optoelectronic module being achieved precisely by routing optomodule contacts 27 on front side 29 differently.

By adjusting the shape of depression 36 to the shape of the optoelectronic module formed from signal-processing chip 41 and chip 43, the optoelectronic module may be positioned at connector module 31 in a simple and reliable manner, while the shape of fiber hole 37 may be adjusted to the exterior shape of the ferrule or of the fiber at the same time, so that a reliable attachment both of the optoelectronic module and of the fiber and/or of the ferrule at connector module 31 results. Since base body 21 comprises a pre-shaped structure of projections, or tabs, 15 and trenches 17, adhesion and/or mechanical connection of molded part 33 to base body 21 is improved.

What is advantageous about the connector module 31 thus configured is, therefore, that a fiber end provided with a ferrule may be inserted, when mounting connector module 31 within a piece of equipment, into fiber hole 37 in a simple manner, so that the fiber inserted into connector module 31 may be positioned reliably opposite an optoelectronic module arranged within depression 36, with chip 43, and thus the fiber has only small tolerances in its arrangement and/or alignment toward the optoelectronic module. This enables reducing, or minimizing, an optical damping of the transition between the optoelectronic module and the fiber end, and to ensure reliable data transmission by means of an optical signal due to the reduced optical loss at the transition from the fiber to the optoelectronic module. The mechanical attachment of the glass fiber to the connector module, or the package, which has thus been performed, is characterized by a high level of positioning accuracy in all three directions, or all three dimensions X, Y, Z, it being possible to additionally position and fix the ferrule within fiber hole 37, for example at a conical tapering, such as a 45° inclination.

At the same time, due to the mechanical stability of latches 15, which are configured with body 12 within a single part, a high level of mechanical stability of the attachment of board contacts 25 on body 12 results, whereas the conductive traces 23 of connector module 31 which are not to be soldered are covered by the molded part such that any bleeding solder cannot cause changes in the circuit functionality. Since conductive traces 23 on base body 21 are covered by molded part 33, they are thus also protected against corrosion, i.e. against any penetrating humidity.

Advantageously, molded part 33 may be configured in such a manner that a notch is formed, for a ferrule mounted on the fiber, into which the ferrule, which has been inserted during spreading of connector module 31, will latch once the spreading has been subsequently cancelled. Thus, the ferrule may be attached in a releasable way to connector module 31 in accordance with an embodiment, so that the POF or the glass fiber may be pulled out in the event of repair work being done, and may be reintroduced, after the repair work, into fiber opening 13 and fiber hole 37 and fixed to connector module 31. The glass-fiber plug and socket connection realized in this manner with connector module 31 is thus releasable, spring slit 35 allowing the fiber to be clamped to connector module 31 in a reversible manner.

To this end, the base body (21) and the molded part (33) form two jaws of a snapping mechanism which enables the fiber to lock into place and, thus, to be fixed.

Spring slit 35 within connector module 31 may be dimensioned such that mounting or de-mounting of the ferrule at connector module 31 is possible with a small amount of force for spreading the connector module and thus for introducing the fiber into fiber hole 37 and/or for pulling it out of fiber hole 37, which results in that the fiber and/or ferrule to be introduced may be fixed to connector module 31 in a manner low in wear.

What is also advantageous is that connector module 31 and fiber hole 37 and/or fiber opening 13 may exhibit small dimensions, so that space requirements for connector module 31 and the optical fiber are small, which again facilitates utilization of the thus implemented arrangement within portable devices, such as mobile telephones. Due to the low space requirement and due to the low vertical dimension of the connector module in accordance with an embodiment, connector module 31 may be configured in a simple manner as an SMD (surface-mount device) component and may thus be mounted on a board at low cost.

Figure 5A:
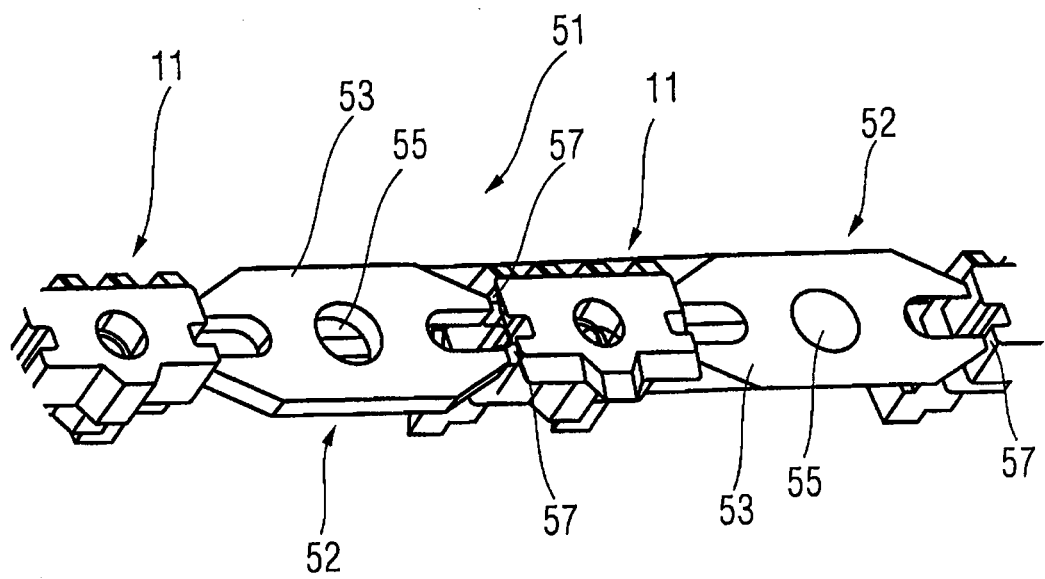
FIG. 5A is a top view of a plurality of base bodies employed for manufacturing the connector module in accordance with a first embodiment, the base bodies being arranged in a chain.
Figure 5B:
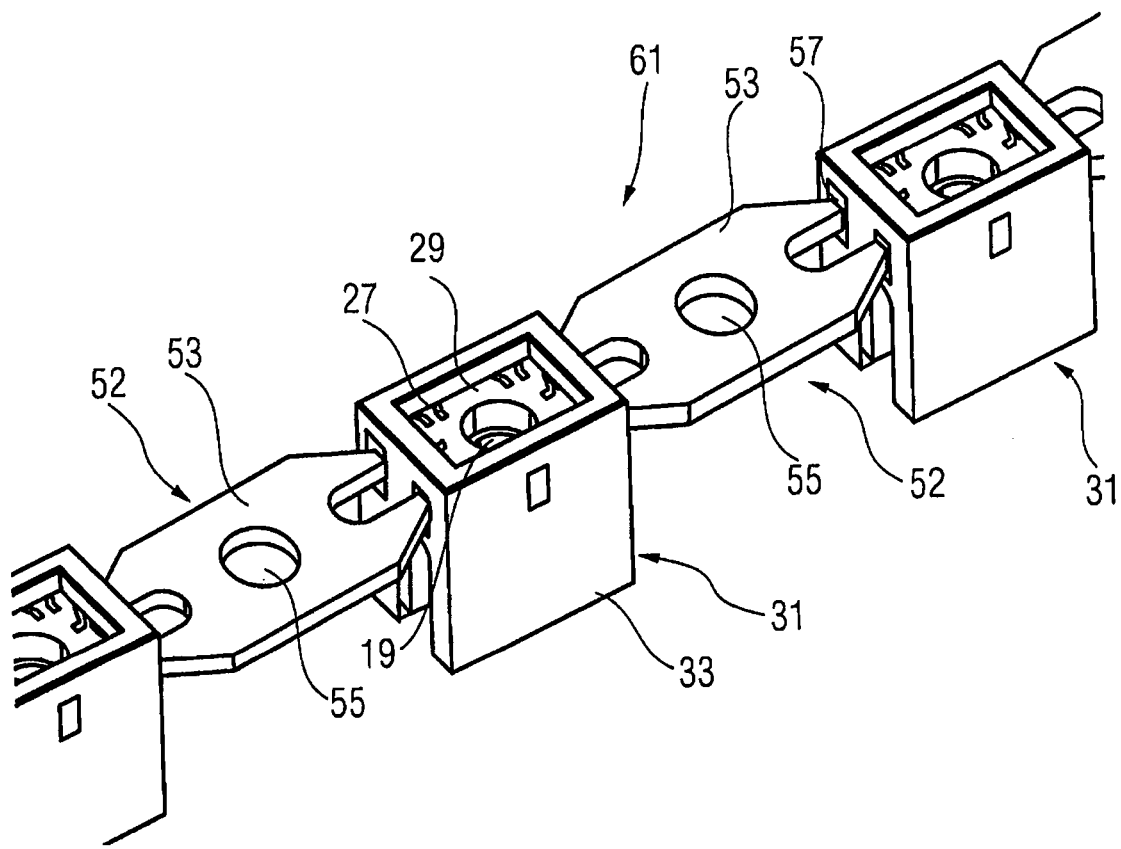
FIG. 5B is a top view of a plurality of connector modules in accordance with a first embodiment which are still arranged in the chain after manufacturing.

FIGS. 5A-B depict a method of manufacturing a connector module in accordance with the above-described embodiment, in accordance with which a chain 51 comprising injection-molded parts 11 is processed. Within chain 51, two injection-molded parts 11 are in each case connected to one another via a connecting link 52. Connecting link 52 comprises a body 53 of each connecting link 52, within which a recess 55, or a hole, is formed. The connecting link 52 is mechanically connected to adjacent injection-molded part 11 at a predetermined breaking point 57, or, more specifically, at two predetermined breaking points 57.

Recess 55 serves to position chain 51 within a tool for processing injection-molded parts 11, predetermined breaking points 57 facilitating connector modules 31, manufactured in the further process steps from injection-molded parts 11, being released from one another. FIG. 5B shows a chain 61 of connector modules 31 in accordance with a first embodiment after injection-molded parts 11, arranged within chain 51, have been processed. In chain 61 depicted in FIG. 5B, two connector modules 31 in accordance with a first embodiment are mechanically connected to one another via connecting link 52 in each case. In a further process step, not shown here, the connector modules 31 arranged within chain 61 are subsequently released from one another so as to mount them on a board, for example.

As has already been explained, an advantage of the structure of connector modules 31 is that they are characterized by low space requirements, which is why chains 61 of connector modules in accordance with a first embodiment 31 may also be transported in a simple manner, and the handling design of chains 51, 61, which is explained only partially here, is thus characterized by low space requirements.

Figure 6A:
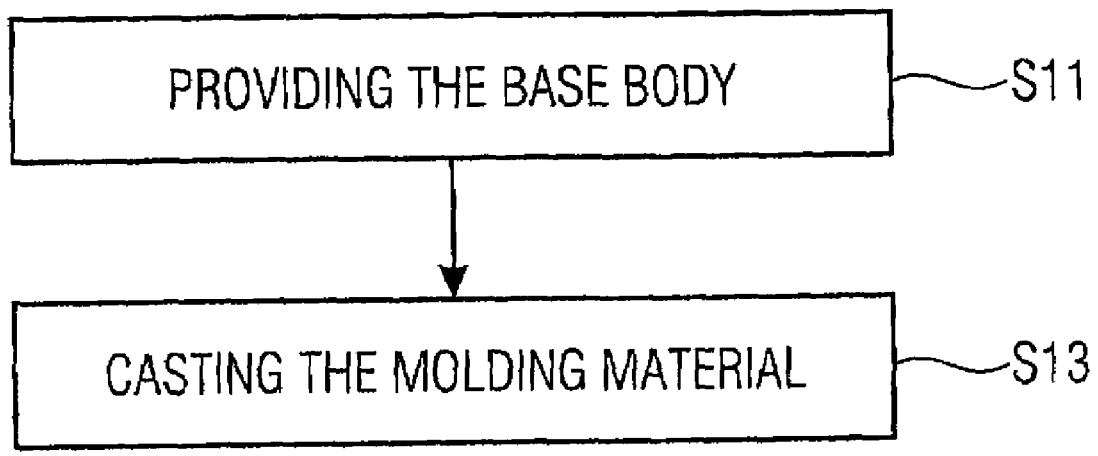
FIG. 6A depicts a method of manufacturing a connector module in accordance with an embodiment.

FIG. 6A explains a method of manufacturing a connector module in accordance with the previous embodiment. In a step S11, a base body having a contact which serves to contact an optoelectronic module, and a further contact which serves to electrically contact a board is provided. The contact and the further contact are formed, or arranged, on a surface of the base body in such a manner that they are connected to one another via a conductive trace on a surface of the base body. The resulting state corresponds, for example, to the state of FIG. 2a-2e. The material of the base body is, for example, a molded body itself which is manufactured from a molding material by injection-molding, however it may also consist of any other material, such as a suitable material which is given the desired shape by means of material ablation.

Subsequently, in a step S13, a molding material 33 is cast onto the base body 11 across part of the surface, so that the conductive trace(s) is (are) partially embedded between the base body and the molded part. Step S11 of providing the base body, and step S13 of casting the molding material are performed such that the base body and the molding material, or the molded part formed from the molding material, define a through-opening for introducing a fiber, such as an optical fiber, which opens, within the connector module thus fabricated, within a contact area of the connector module, the contact for contacting the optoelectronic module being also arranged at that contact area at which the through-opening opens in order for the fiber to be introducing.

Figure 6B:
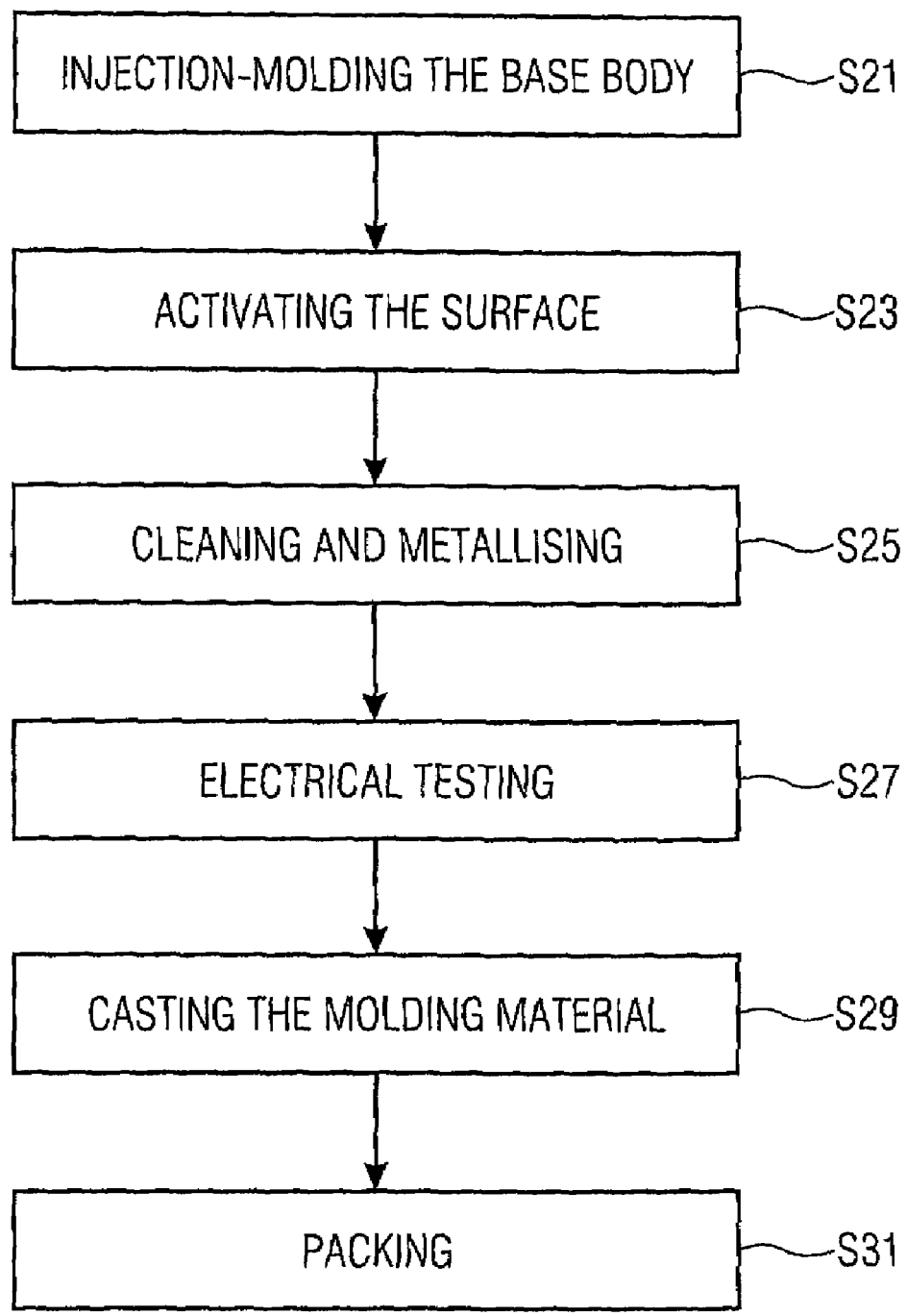
FIG. 6B depicts a method of manufacturing a connector module in accordance with a first embodiment.

FIG. 6B illustrates a more detailed method of manufacturing a connector module in accordance with a further embodiment. Here, in a step S21, an injection-molded body is generated, or the injection-molded part of the base body is manufactured, an injection-molding material being injected into a mold. The result corresponds, for example, to the state obtained subsequently to FIGS. 1a, 1b. Thereafter, in a step S23, in surface of the injection-molded part produced in step S21 is activated, by means of laser direct structuring (LDS), using laser energy, in an area where further contacts, e.g. 25 and 27, or conductive traces and/or metallizations, such as 23, are to be applied in further process steps. Subsequently, in a step S25, the injection-molded part thus processed is cleaned, and the contacts and conductive traces are deposited in the active areas. Depositing the conductive traces and contacts may be performed, e.g., by means of electro-depositing a metal layer for the contacts and the conductive trace. The resulting state corresponds, e.g., to the state of FIGS. 2a-2e.

Thereafter, the base body generated in step S25 is electrically tested in a step S27, it being possible, for example, to check a verification of the electric connection between a contact for the optoelectronic module and a board contact. Then, in a post-mold step S29 which essentially corresponds to the previously described step S13, the metallization formed on the base body is partially covered by a molding mass 33, and a connector module thus generated is packed in a step S31, for example so as to further process the connector modules thus manufactured at a further place of production.

With reference to 7a-9b, embodiments of a connector module in accordance with a second embodiment will be described, in accordance with which the connector module includes no injection-molded part or other three-dimensional volume bodies as the base bodies but a flexible circuit board having contacts and electrical connections in between on its surface. A molded part is provided, again which partially covers the electrical connections, so that the ease of use of the connector module is increased, a through-hole again being provided within the board for the fiber which opens for an optoelectronic device at a contact area of the board.

Figure 7A:
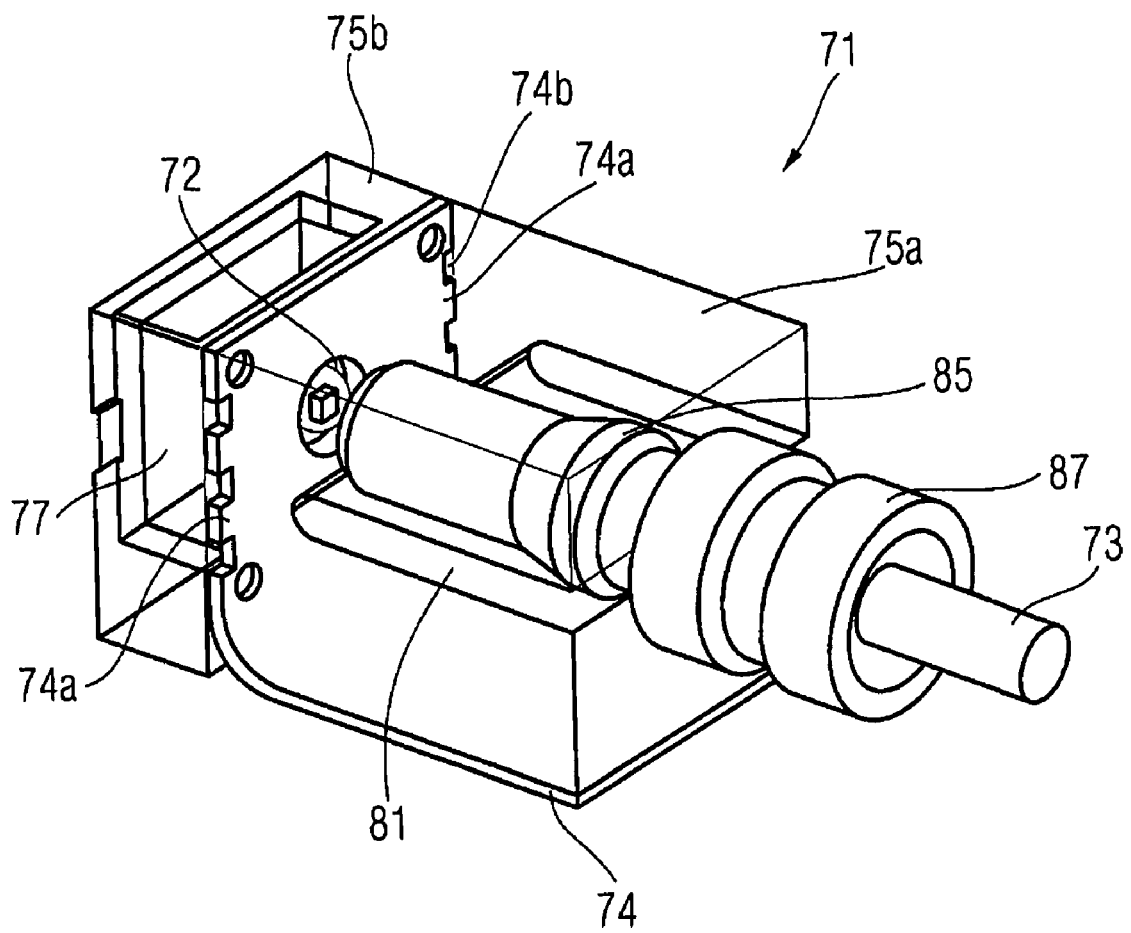
FIG. 7A depicts a sectional view of a connector module in accordance with a second embodiment, comprising an introduced fiber and an optoelectronic module.

FIG. 7A shows an architecture of a connector module having an optoelectronic module 72 and a fiber 73 introduced into connector module 71. Connector module 71 comprises a board 74, on which a first molded part 75a is generated on a surface of the board 74 which faces fiber 73, and a second molded part 75b is generated on a surface of board 74 which faces away from fiber 73. Within the second molded part 75b, a cavity 77 is formed which has optoelectronic module 72 arranged therein and extends to a hole within board 74, and into and through the hole. Along its edge, board 74 as indentations 75b which have portions 74a formed between them which, in this example, project. The structured shape of the side face of board 74 including the projecting portions 74a and the recesses 74b supports mechanical adhesion, or connection, between the molded parts 75a, 75b, since, when the molding material is cast, the molding material penetrates into the recesses formed between the projecting portions, so that a kind of interlocking occurs between the molding material and the board.

The first molded part 75a comprises a spreading slit 81 serving to enable the fiber 73 to be introduced in a spread state of the first molded part 75a. Fiber 73 has a ferrule 85 and a handling design 87 mounted thereto, the fiber being introduced into the arrangement of ferrule 85 and handling design 87, the arrangement consisting of one single part. In a non-spread state of connector module 71, shown here, fiber 73 is fixed to first molded part 75a via ferrule 85 such that an end of fiber 73 is opposite the hole within board 74, and that a beam of light emerging from the fiber may impinge on an optically active area of a chip arranged within optoelectronic module 72, and/or such that a beam of light generated by the optically active area of the chip may enter into fiber 73.

Figure 7B:
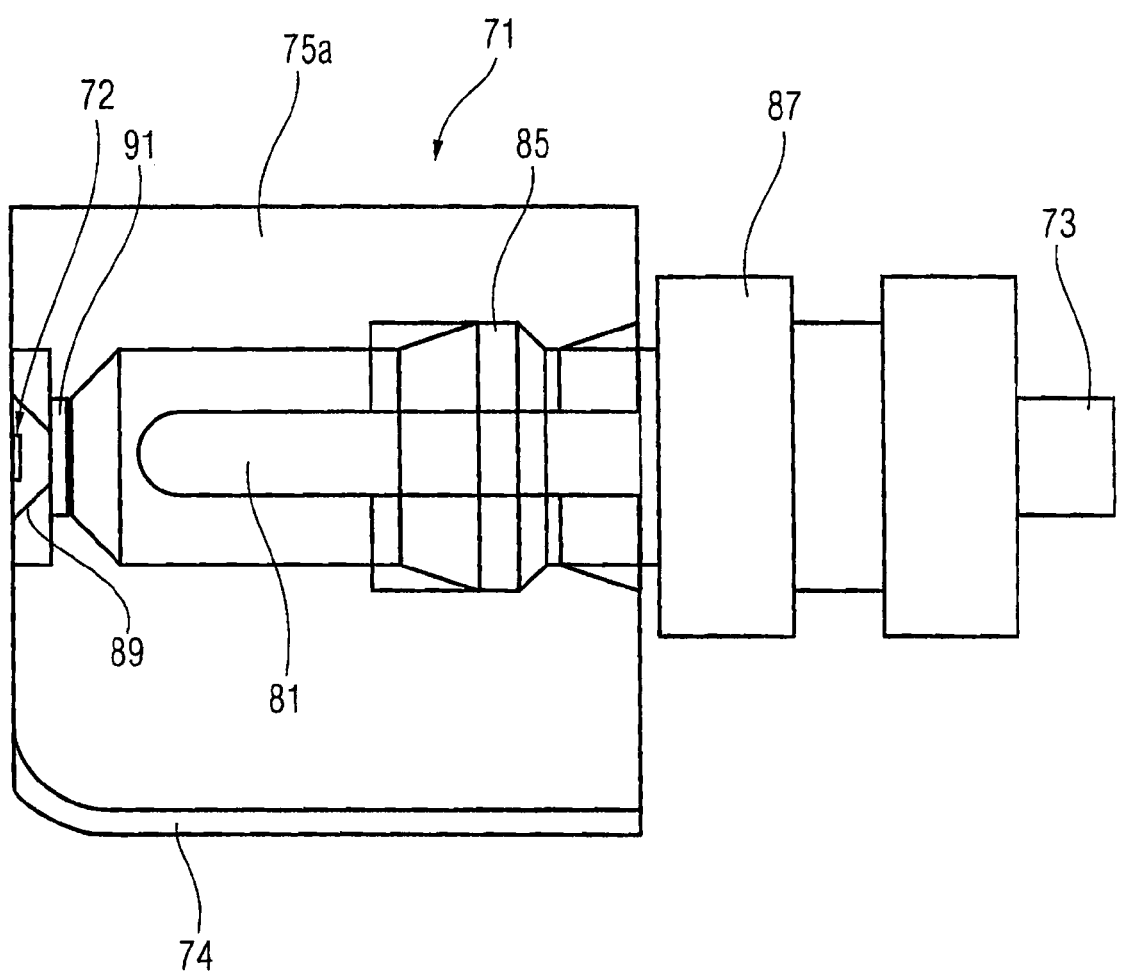
FIG. 7B depicts a first cross-sectional view of the connector module in accordance with a second embodiment, comprising the introduced fiber and the optoelectronic module.

FIG. 7B shows a cross-sectional view of a part of connector module 71 around which the board extends. FIG. 7B clearly shows that optoelectronic module 72 is embedded in a transparent molding mass, or a globe top 89, and that optoelectronic module 72 consequently is positioned, or aligned, opposite fiber 73, optical module 72 not directly abutting against an end of fiber 73 which faces optical module 72, but being spaced from the fiber by a gap, not shown in FIG. 7B, within the recess 91. A distance between fiber 73, or the fiber end, and optoelectronic module 72, or a width of the gap within recess 91, is within a range of several hundred μm, or within a range from 100 μm to 800 μm.

Figure 7C:
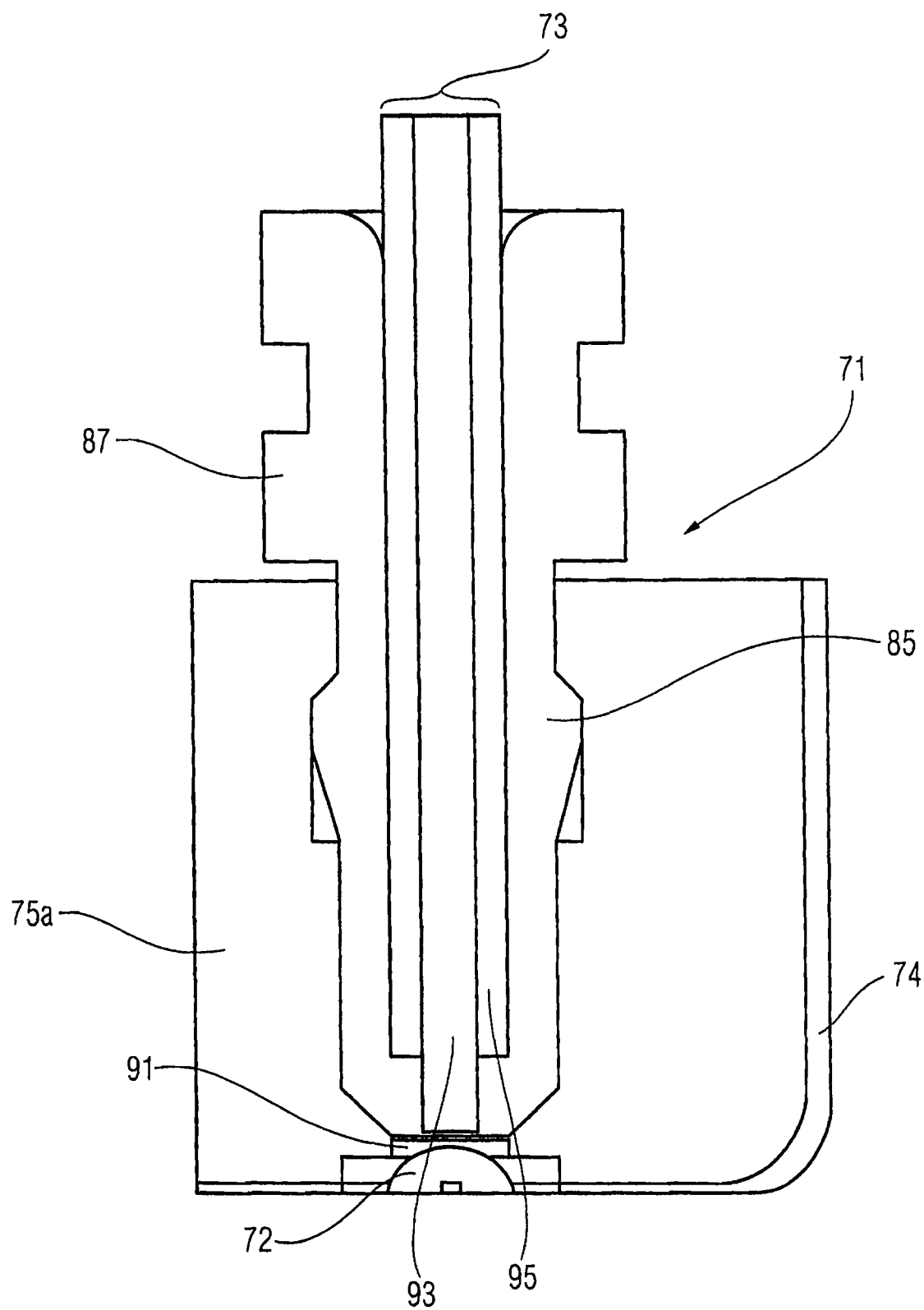
FIG. 7C depicts a second cross-sectional view of the connector module in accordance with a second embodiment, comprising the introduced fiber and the optoelectronic module.

FIG. 7C shows a further cross-sectional view of connector module 71, the section of connector module 71 being selected such that, in comparison with the view shown in FIG. 7B, that board 74 is shown completely and that fiber 73 is also represented in its cross-section. In the cross-section of fiber 73 thus represented, a fiber core 93 and a fiber cladding 95 surrounding fiber core 93 are depicted. Fiber core 93 is arranged, or aligned, opposite optoelectronic module 72 such than an optical axis extending through the center, or a center point, of fiber core 93 extends through a center point of hemispherical optoelectronic module 72, or such that a center point of hemispherical optoelectronic module 72 is spaced away from the optical axis of fiber 73 by less than 10% of the radius of hemispherical optoelectronic module 72. The optical axis corresponds to a symmetry axis of the fiber core.

Figure 8:
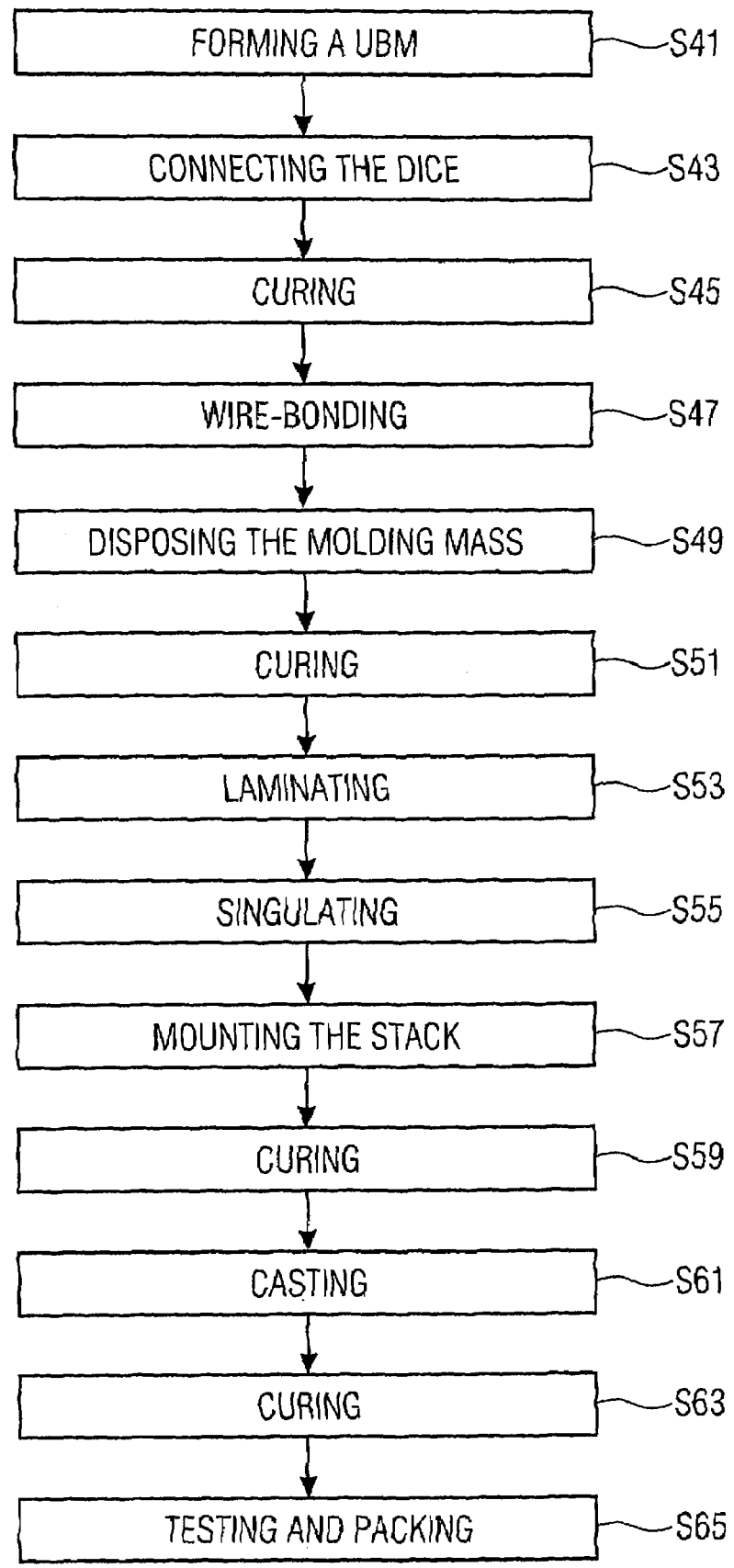
FIG. 8 depicts a method of manufacturing and mounting an optoelectronic module implemented within a connector module in accordance with an embodiment.

FIG. 8 illustrates a method of manufacturing an optoelectronic module for one of the above-described connector modules and for mounting the optoelectronic module to a respective connector module in accordance with an embodiment. In a step S41, a UBM (under-bump metallization) is formed on a chip comprising an optically active area, and on a signal-processing chip. What is advantageous about forming the UBM on the signal-processing chip, or the ASIC, is that the UBM facilitates subsequent generation of a wire connection to an optically active chip, the wire being glued or soldered either directly to the UBM, or to an aluminum pad or a gold pad on the UBM. The UBMs are configured, for example, as nickel-gold bumps (NiAu bumps), as nickel-palladium-gold bumps (NiPdAu bumps), or as stud bumps.

After forming S41 the UBMs, the dice (semiconductor chips) located on the opposing wafers are connected with one another, respectively, in a step S43, two of the contacts, for example, one of which is located on the signal-processing chip and the other on the chip comprising the optically active area, being connected to one another by means of a conductive adhesive, such as silicon adhesive. Thereafter, the wafer stack thus generated, or the group of stacked dice thus generated, is heated in a step S45, so that the conductive adhesive creating the connection between the signal-processing chip and the chip comprising the optically active area hardens. Subsequently, an electrical connection is created between an electrical contact on the chip comprising the optically active area and an electrical contact on the signal-processing chip by means of wire-bonding in a step S47, this process step also being referred to as the wire-bonding step.

Subsequently, a so-called globe top, or a molding mass is cast, in a step S49, on the stack, thus produced, of the signal-processing chips and the chips comprising the optically active area. The globe top may be formed, for example, from a transparent material, may comprise, for example, a transparent polymer. The molding mass is cast such that the chip comprising the optically active area is fully covered by the signal-processing chip and the molding mass. Thereafter, the wafer stack, or chip stack, thus built is heated in a step S51, so that the molding mass hardens. Thereafter, the chips arranged within the wafer stack are glued onto a foil, and thus laminated, in a step S53. After the step of laminating S53, the chips arranged within the wafer stack are separated from one another and singulated in a step S55. Singulating is performed, e.g., by means of a saw. In a step S57, the singulated chip stacks thus arranged on the foil are individually detached from the foil and arranged and/or mounted on a connector module in accordance with an embodiment. Mounting the singulated chip stack of the signal-processing chip and the chip comprising the optically active area onto the connector module and/or the MID is performed, e.g., by means of flip-chip technology. Here, for example, a connection between the contact on the chip stack and an optomodule contact on the connector module may be created by means of a conductive adhesive.

The connector module to which the chip stack is fixed is heated in a step S59, so that the adhesive bond between the contact at the connector module and the chip stack hardens. Thereafter, in a step S61, a depression is cast in the connector module in accordance with an embodiment, within which the chip stack is fixed, and the connector module thus cast is heated with the chip stack in a step S63 to harden the molding mass disposed within the depression. Thereafter, the connector module comprising the optoelectronic chip module is tested, in a step S65, and subsequently packed so that it may be mounted to a board, for example at a further production site.

The method illustrated in FIG. 8 of mounting the chip stack onto the connector module allows gluing or soldering the chip stack very accurately within the connector module in a simple manner, so that the chip stack may be very accurately positioned opposite the optical axis of a fiber opening existing within the connector module. By casting the connector module with the optoelectronic chip module attached thereto in the casting step S61 in such a manner that a cavity existing within the connector module and having the optoelectronic chip module attached therein is sealed with the molding mass, a robustness and reliability of the connector module in accordance with an embodiment comprising the mounted optical chip module is increased. For the chip module arranged within the depression, or the chip stack, is protected by the molding mass against environmental effects, such as moisture penetration, it being primarily the conductive traces or contacts existing on the chip module and at the connector module which are covered by the molding mass and thus protected against corrosion.

Figure 9A:
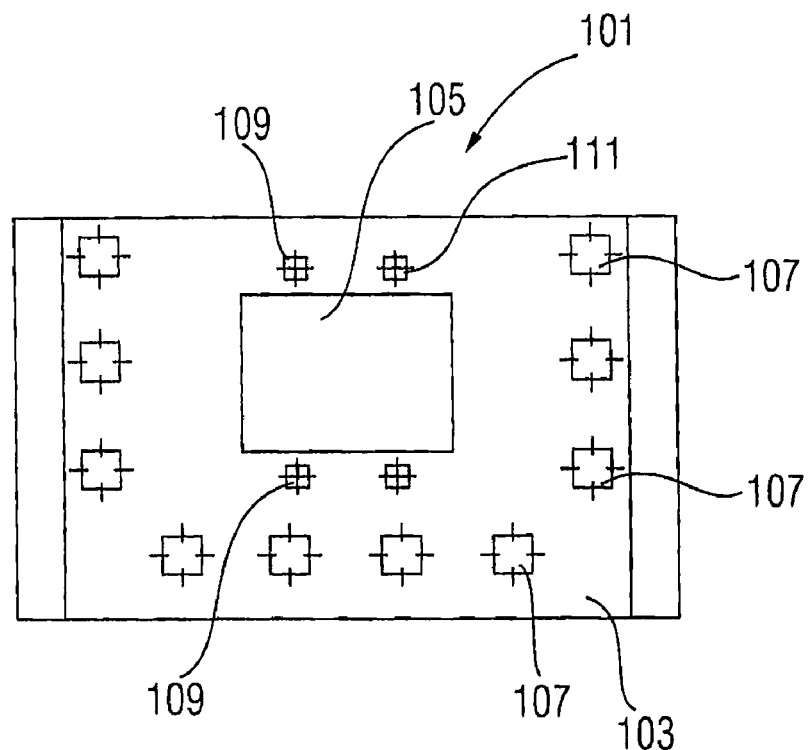
FIG. 9A is a front view from above of an optoelectronic transmitter module employed within a connector module in accordance with an embodiment.

FIG. 9A illustrates a top view of an optoelectronic transmitter chip module 101 mountable on a contact area of one of the above-described connector modules. Chip module 101 comprises a signal-processing chip 103 and a laser chip 105 which may be configured, for example, as a VCSEL (vertical cavity surface-emitting laser) chip, wherein the light is radiated perpendicularly to a plane of the semiconductor chip. The signal-processing chip 103 has attachment contacts 107 and wire-bonding contacts 109 arranged thereon. The attachment contacts 107 serve to attach transmitter chip module 101 to the connector module in accordance with an embodiment, while a wire-bonding 111 to laser chip 105 is created via wire-bonding contacts 109. The wire-bonding contacts are configured, e.g., as UBMs or aluminum pads on a surface of signal-processing chip 103.

Figure 9B:
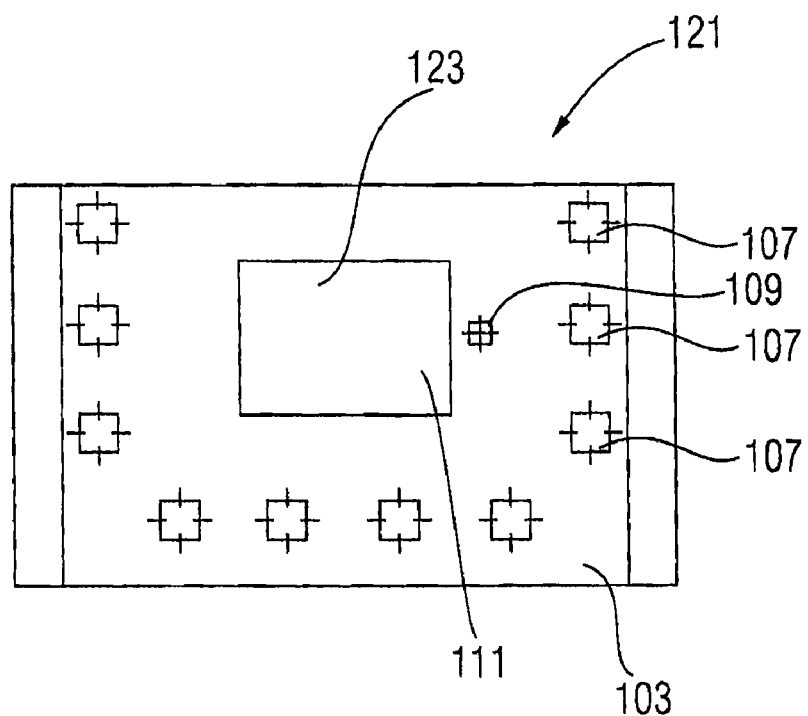
FIG. 9B is a front view from above of an optoelectronic receiver module employed within a connector module in accordance with an embodiment.

FIG. 9B shows an optoelectronic receiver chip module 121 which may also be mounted on a contact pad of one of the above-described connector modules. In the following, like elements of optoelectronic transmitter chip module 101 shown in FIG. 9A will be designated by identical reference numerals. In addition, a description of the structure and mode of operation of optoelectronic receiver chip module 121 will be limited to a description of the differences as compared to the structure and mode of operation of optoelectronic transmitter chip module 101. Unlike transmitter chip module 101, receiver module chip module 121 has a photodiode chip 123 arranged on signal-processing chip 103, and the arrangement of wire-bonding contacts 109 on signal-processing chip 103 is therefore modified as compared to transmitter chip module 101.

Connector module 31 comprises injection-molded part 11 on which the metallization layers and/or conductive traces 23 and contacts 25, 27 are deposited. However, alternatively, a connector module in accordance with a further embodiment could comprise any three-dimensional base body with metallization layers deposited thereon. What is also feasible is to use an injection-moulded part consisting of two different molding materials for producing a connector module in accordance with a further embodiment, instead of injection-molded part 11 consisting of one molding material, a first molding material forming a base body and a second molding material, which may be activated by a laser for depositing a metallization layer, being cast onto the base body. At the same time, connector modules 31, 71 in accordance with an embodiment comprise three-dimensional interconnect structures, such as MID structures, but any embodiments of the connector modules consisting of a base body and a molded part cast thereon are alternatives to this.

Any methods desired for creating the metallizations on base body 21 are possible, it also being possible to deposit the conductive traces and contacts and/or the metallizations by means of foil back-injection. Also, in the method shown in FIG. 6B of manufacturing a connector module in accordance with an embodiment, steps S23 of activating the surface, and S25 of metallizing could be replaced by so-called subtractive laser direct structuring, wherein a metallization layer is fully deposited onto the surface of the base body, or of the injection-molded part, and the metallization layer is subsequently removed again in those areas where no conductive traces or contacts are to be produced. If the metallization is created by means of active laser structuring, the surface of body 12 will be cleaned, after the laser activation, or laser structuring, and prior to forming the conductive traces and/or to metallizing, from the contamination produced by the laser activation. If the metallization is produced by means of subtractive laser direct structuring, the structured surface of the base body will be cleaned, after removing the metallization by means of laser energy, in those areas where no conducting layers are to remain on the base body. However, the steps of cleaning the base body may also be dispensed with in a method of manufacturing the connector module in accordance with an embodiment.

In addition, with a connector module in accordance with a further embodiment, any number of optomodule contacts 27 could be arranged at front face 29, such as, for example, only one optomodule contact, or any number of board contacts 25, such as only one board contact, could be arranged on a surface of connector module 31. A connector module in accordance with a further embodiment could also comprise any number of conductive traces 23, such as only one conductive trace. With connector modules 31, 71, the respective molded parts may be made of any molding material, such as plastic. In addition, with connector module 71, board 74, or flexible board 74, may be made of any insulating material on which, e.g., the metallization layers of the contacts and conductive traces are formed in a photo-galvanic manner.

For example, connector modules 31, 71 may be employed for optical data transmission from one server to a further server in a so-called short-range application or, in optical transmission technology, in switching centers. What is also feasible, however, is any type of application of connector modules 31, 71, such as in a high-speed range of data transmission technology or in parolis facilities (parolis=parallel-optical link).

Any optical fibers, such as POFs, which are frequently employed for optical transmission links comprising low data rates or only short transmission distances may be introduced into the fiber openings existing within the connector modules 31, 71.

Figure 10A:
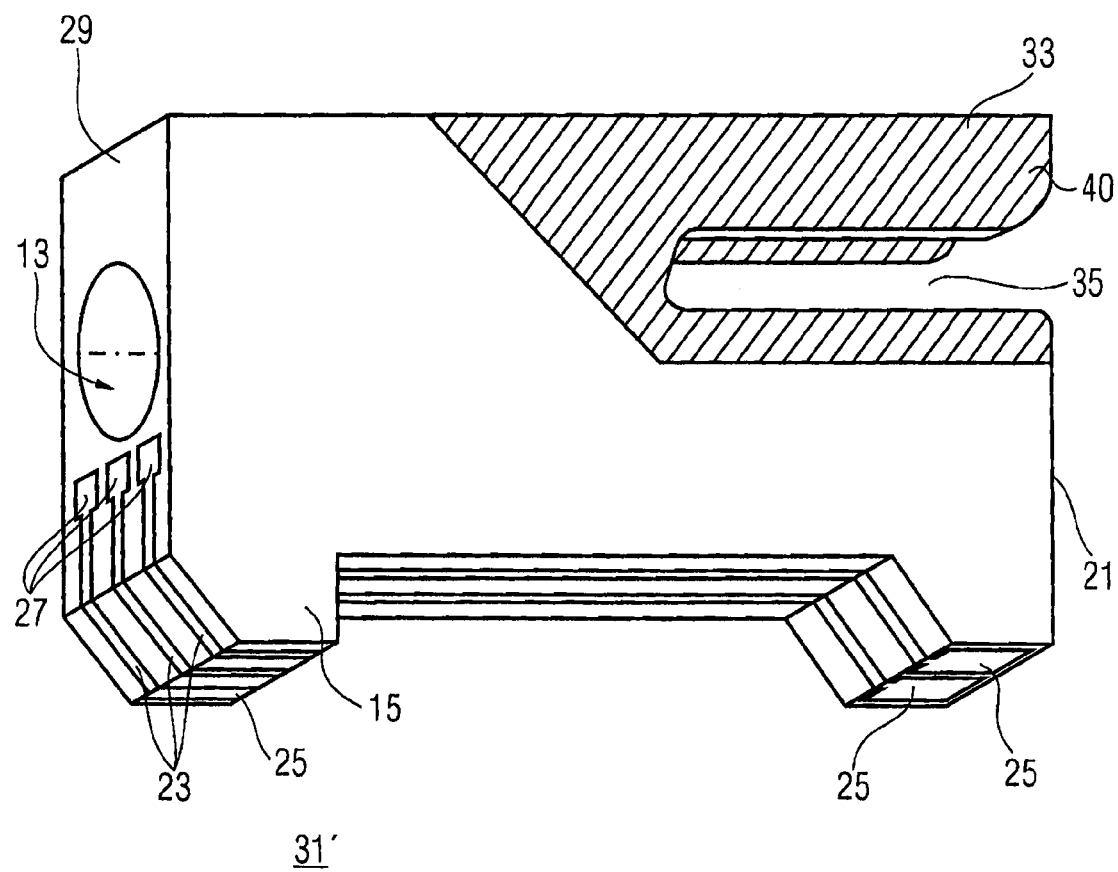
FIGS. 10a to 10e are spatial views from below, at an angle, of a connector module in accordance with further embodiments.
Figure 10B:
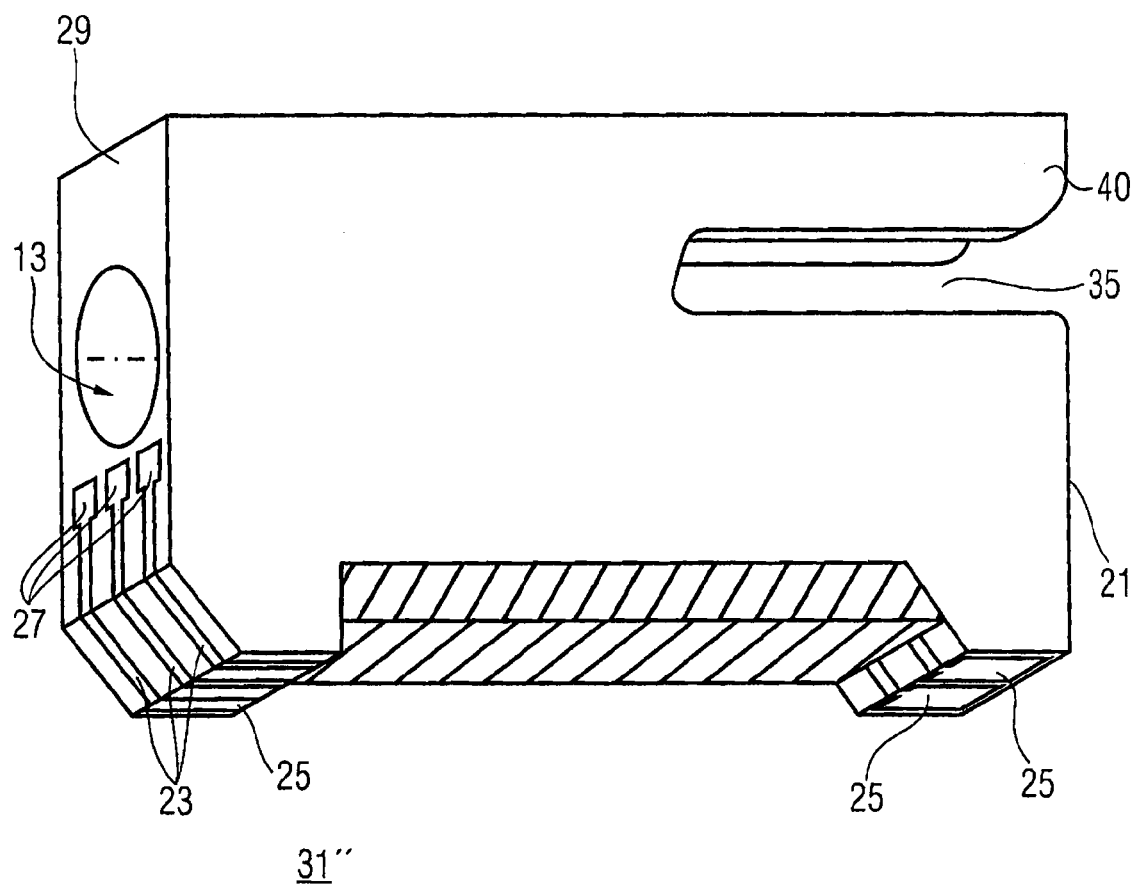
Figure 10C:
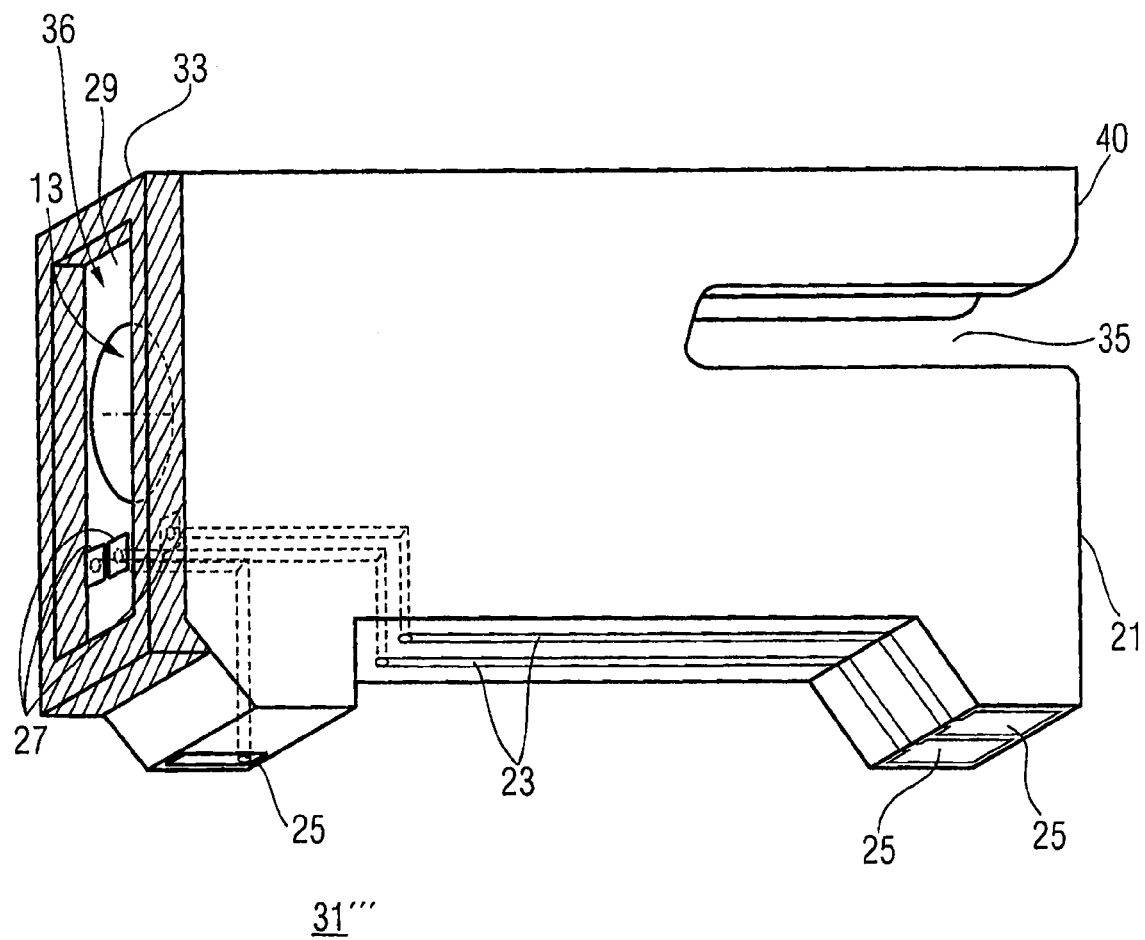
Figure 10D:
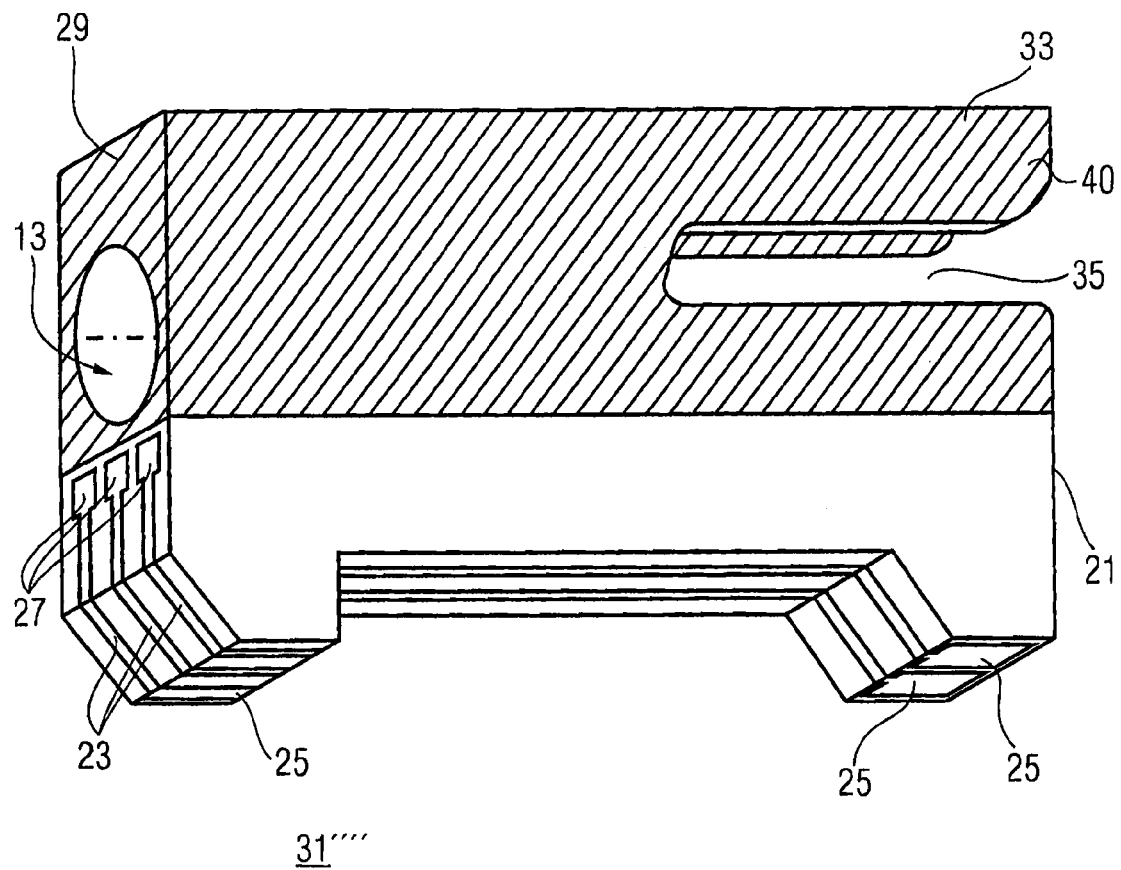
Figure 10E:
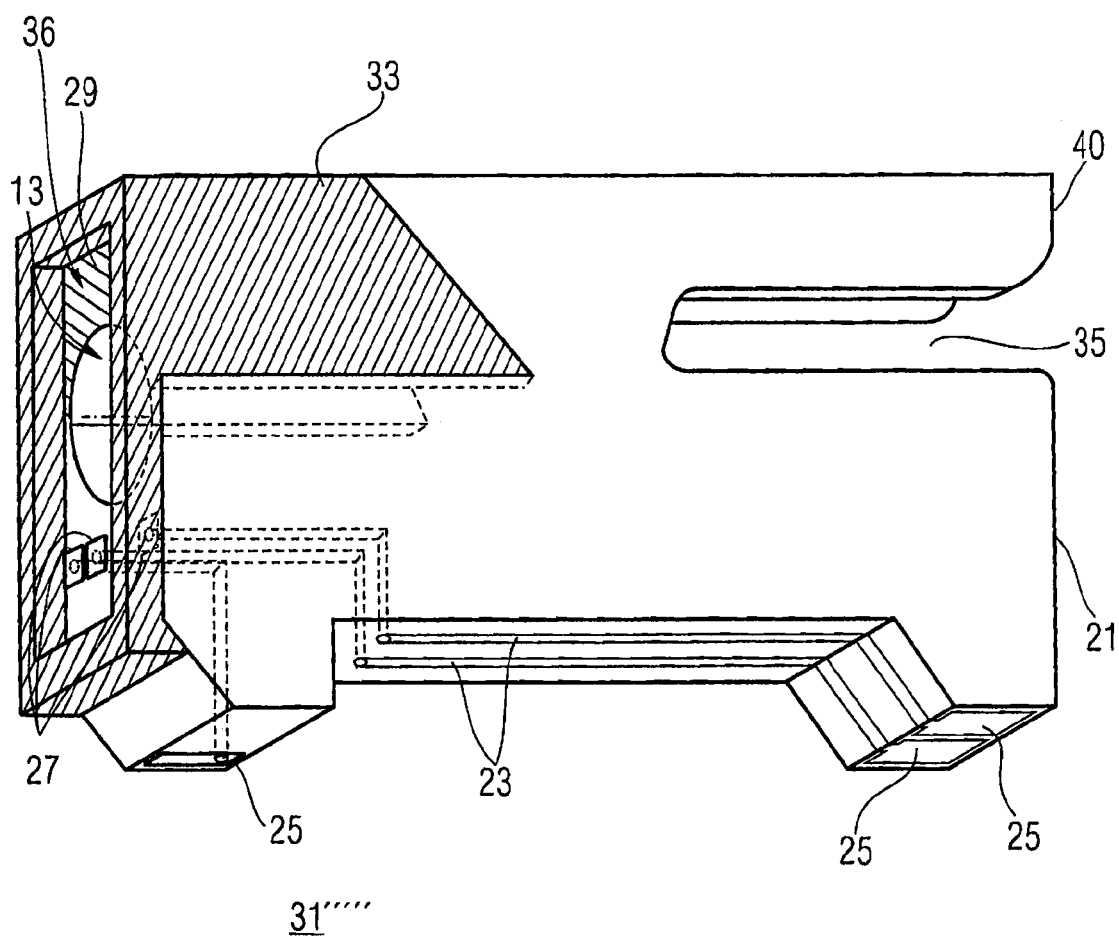

It shall also be noted that above embodiments, or configurations, may be varied further. For example, it is not necessary for the molded part to be cast on the base body in such a manner that it is at the same time responsible for forming the depression 36 to define the spring mechanism for holding the fiber, and to partially cover conductive traces 23. Rather, molded part 23 may serve other purposes and/or take on only individual ones of these functions. FIGS. 10a-10e show various embodiments in this respect, wherein one connector module is depicted using the reference numerals of, for example, FIGS. 3a-3c, however several details having been omitted as compared with FIGS. 3a-3c to avoid the viewer being distracted by details. FIG. 10a, for example, depicts a connector module 31', wherein a depression 36 for the optomodule (not shown here) is not provided. What is shown are the front faces 29 of base body 21 as well as conductive traces 23, extending on the surface of base body 21, between optomodule contacts 27 and board contacts 25. FIG. 10a shows a molding material 33 cast onto the base body 21 such that it merely defines the spring part for fixating the fiber, such as, by way of example, spring slit 35 and spring lip 40. Configuring the base body 21 to improve interlocking of molded part 33 with base body 21 is not shown in FIG. 10a to simplify the representation, but may also be provided. FIG. 10b shows a connector module 31", wherein the base body 21 includes, on its surface, conductive traces 23 with contacts 25 on the bottom side and contacts 27 on the front face 29, as well as the spring mechanism, or spring lip 40 and spring slit 35. In accordance with FIG. 10b, molded part 33 is cast onto base body 21 in such a manner that it merely takes on the function of covering conductive traces 23, so that same are embedded between base body 21 and molding materials 33. FIG. 10c shows a connector module 31''', wherein molding material 33 is cast onto base body 21 such that it merely defines depression 36 adjoined by contact area 29 with the optomodule contacts 27 located thereon. FIG. 10c shows that it is possible that the electrical connection between optomodule contacts 27 and board contacts 25 need not necessarily be established via the surface, but may also extend partially through the interior of base body 21, as is indicated in FIG. 10c by dashed lines which depict wires, for example. FIG. 10d shows a connector module 31'''', wherein the molded part 33 is cast onto base body 21 such that it forms the entire fiber introduction passageway, i.e. opening 13 at front face 29 to the spring mechanism with spring slit 35 and spring lip 40 at the end opposite front face 29, from where the fiber is introduced. By way of example, base body 21 here supports only contacts 27, 25 and conductive traces 23 on its surface without co-defining part of the fiber opening. Finally, FIG. 10e depicts a connector module 31''''', wherein, like in the embodiment of FIG. 10c, molded part 33 is cast onto base body 21 such that it only takes on the definition of depression 36. However, unlike the embodiment of FIG. 10c, FIG. 10e illustrates that it is also possible for fiber opening 13 at front face 29 to not be fully defined by base body 29, but partly by molded part 33. In other words, the cross-section of fiber opening 13 is not solely defined by base body 21, unlike the other embodiments described above, but the cross-section of this fiber opening 13 is partly defined—in FIG. 10e, for example, is half defined—by molded part 33 and base body 21 together. Of course, combinations of the previously described embodiments of FIGS. 10a-e are also feasible. In addition, they are also transferable to the embodiment of FIGS. 7a-7c as variations.

In the methods shown in FIG. 6B, steps S21, S23, S25 and S27, there comprising a first molding step and a step of depositing a metallization, may be replaced by any process steps of producing a base body having two contacts which are arranged on a surface of the base body and via an electrical conductive trace also arranged on the surface of the base body. What is also feasible is any execution of step S29 of pre-molding and/or of casting the molded part, as long as part of the conductive trace on the surface of the base body is covered, and the connector module thus produced comprises an opening for introducing a fiber.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A connector module comprising:
    a base body having a first contact for electrically contacting an optoelectronic module, and a second contact for electronically contacting a board, and a conductive trace for electrically connecting the first and second contacts, at a surface of the base body; and
    a molded part,
    the molded part being cast onto the base body across part of the surface, the base body and the molded part together defining an opening for introducing a fiber.

2. The connector module as claimed in claim 1, wherein the molded part at least partially covers the conductive trace.

3. The connector module as claimed in claim 1, wherein the opening opens within a contact area of the connector module which includes a further part of the surface within which the first contact is formed.

4. The connector module as claimed in claim 1, wherein the base body comprises a molding material.

5. The connector module as claimed in claim 1, wherein the base body includes a flexible board.

6. The connector module as claimed in claim 3, wherein the optoelectronic module may be placed, with a front side of same, onto the contact area, so that a transparent molding mass arranged on the front side of the optoelectronic module may extend into the opening.

7. The connector module as claimed in claim 3, wherein the optoelectronic module is an optoelectronic chip module comprising a first chip which abuts, with a front side of same, on the contact area and supports, on the front side, a second chip surrounded by a transparent molding mass, so that the molding mass and the second chip extend into the opening.

8. The connector module as claimed in claim 7, wherein the second chip comprises an optical transmitter or an optical receiver, and the first chip is a signal-processing chip.

9. The connector module as claimed in claim 7, wherein a first chip contact on the front side of the first chip contacts the first contact of the connector module, and a second chip contact on the front side of the first chip is electrically connected to a chip contact at the second chip.

10. The connector module as claimed in claim 6, wherein a further molding material secures the optoelectronic module such that it adjoins the opening, and at the same time covers a back side of the optoelectronic module.

11. The connector module as claimed in claim 1, wherein the base body comprises a flexible board having indentations at an edge thereof, or holes, so that the molded part extends continuously from a first side of the flexible board having the first contact arranged thereat to a second side of the flexible board which is opposite the first, so as to border on both sides of the flexible board.

12. The connector module as claimed in claim 11, wherein the base body comprises a flexible board having indentations at an edge thereof, or holes, so that the molded part extends continuously from a first side of the flexible board having the first contact arranged thereat to a second side of the flexible board which is opposite the first, so as to border on both sides of the flexible board.

13. A connector module comprising:
    a base body having a first contact for electrically contacting an optoelectronic module, and a second contact for electronically contacting a board, and a conductive trace for electrically connecting the first and second contacts, at a surface of the base body; and
    a molded part,
    the molded part being cast onto the base body across part of the surface, and at least one of the base body and the molded part defining an opening for introducing a fiber,
    wherein the surface of the base body comprises a portion having projecting and recessed parts with which the molded part is interlocked.

14. A connector module comprising:
    a base body having a first contact for electrically contacting an optoelectronic module, and a second contact for electronically contacting a board, and a conductive trace for electrically connecting the first and second contacts, at a surface of the base body; and a molded part,
the molded part being cast onto the base body across part of the surface, and at least one of the base body and the molded part defining an opening for introducing a fiber,
wherein the opening opens within a contact area of the connector module which includes a further part of the surface within which the first contact is formed, and
wherein the base body defines a full cross-section of an end of the opening which opens at the contact area and forms a receptacle of an end of the fiber, and the molded part together with the base body forms a snapping mechanism, for holding the fiber in the receptacle, at a second end of the through-opening which is opposite the first end.

15. A connector module comprising:
a base body having a first contact, a second contact and a conductive trace electrically connecting the first and second contacts, at a surface of the base body; and
a molded part,
the molded part being cast onto the base body across part of the surface, the base body and the molded part together defining a fiber introduction opening for introducing a fiber.

16. The connector module as claimed in claim 15, the molded part at least partially covers the conductive trace.

17. The connector module as claimed in claim 15, wherein the opening opens within a contact area of the connector module which includes a further part of the surface within which the first contact is formed.

18. The connector module as claimed in claim 15, wherein the base body comprises a molding material.

19. The connector modules as claimed in claim 15, wherein the base body includes a flexible board.

20. The connector module as claimed in claim 17, wherein the optoelectronic module may be placed, with a front side of same, onto the contact area, so that a transparent molding mass arranged on the front side of the optoelectronic module may extend into the fiber introduction opening.

21. The connector module as claimed in claim 17, comprising an optoelectronic chip module comprising a first chip which abuts, with a front side of same, on the contact area and supports, on the front side, a second chip surrounded by a transparent molding mass, so that the molding mass and the second chip extend into the fiber introduction opening.

22. The connector module as claimed in claim 21, wherein the second chip comprises an optical transmitter or an optical receiver, and the first chip is a signal-processing chip.

23. The connector module as claimed in claim 21, wherein a first chip contact on the front side of the first chip contacts the first contact of the connector module, and a second chip contact on the front side of the first chip is electrically connected to a chip contact at the second chip.

24. The connector module as claimed in claim 17, wherein a further molding material secures the optoelectronic module such that it adjoins the fiber introduction opening, and at the same time covers a back side of the optoelectronic module.

25. A connector module, comprising:
a base body having a first contact, a second contact and a conductive trace electrically connecting the first and second contacts, at a surface of the base body; and
a molded part,
the molded part being cast onto the base body across part of the surface, and at least one of the base body and the molded part defining a fiber introduction opening,
wherein the surface of the base body comprises a portion having projecting and recessed parts with which the molded part is interlocked.

26. A connector module, comprising:
a base body having a first contact, a second contact, and a conductive trace electrically connecting the first and second contacts, at a surface of the base body; and
a molded part,
the molded part being cast onto the base body across part of the surface, and at least one of the base body and the molded part defining a fiber introduction opening,
wherein the surface of the base body comprises a portion having projecting and recessed parts with which the molded part is interlocked, and wherein the base body defines a full cross-section of an end of the fiber introduction opening which opens at the contact area and forms a receptacle of an end of a fiber, and the molded part together with the base body forms a snapping mechanism, for holding the fiber in the receptacle, at a second end of the through-opening which is opposite the first end.

27. A connector module comprising:
a base body having a first contact, a second contact and a conductive trace electrically connecting the first and second contacts, at a surface of the base body, and a through-opening opening at a first end of same at a contact area of the base body, within which the first contact is formed; and
a molded part cast onto the base body across part of the surface, so that the conductive trace is at least partly covered by the molded part, and that the base body and the molded part together form a snapping mechanism at a second end, opposite the first end, of the through-opening.

28. The connector module as claimed in claim 27, wherein the base body comprises a molding material.

29. The connector module as claimed in claim 28, wherein the base body includes a flexible board.

30. A method of manufacturing a connector module, the method comprising:
providing a base body having a first contact for electrically contacting an optoelectronic module, and a second contact for electronically contacting a board, and a conductive trace for electrically connecting the first and second contacts on a surface of the base body; and
casting a molding material onto the base body across part of the surface, so that the base body and the molded part together define an opening for introducing a fiber.

31. The method as claimed in claim 30, wherein the casting is performed such that the molded part at least partly covers the conductive trace.

32. The method as claimed in claim 30, wherein providing the base body is performed such that the opening opens within a contact area of the connector module, which includes a further part of the surface wherein the first contact is formed.

33. The method as claimed in claim 30, wherein providing the base body comprises injection-molding.

34. The method as claimed in, claim 30, wherein providing the base body comprises activating an area of the surface by means of radiation energy, and metallizing the activated area of the surface so as to form at least one of the first contact, the second contact and the conductive trace.

35. The method as claimed in claim 30, wherein providing the base body comprises providing the base body with a structured side having projecting and recessed portions, and the step of casting leads to the recessed portions being partly refilled with the molding material to produce an interlocking between the base body and the molding material.

36. The method as claimed in claim 30, wherein providing the base body comprises providing same along with a plurality of further base bodies in a chain of base bodies.

37. The method as claimed in claim 36, wherein providing the base body along with a plurality of further base bodies in a chain of base bodies is performed such that the base body is connected to adjacent ones of the plurality of further base bodies via a connecting link, respectively, a predetermined breaking point being formed at a boundary between the connecting link and the base body, respectively.

38. The method as claimed in claim 36, further comprising positioning of the base body using a feature in the connecting link as a point of reference.

39. The method as claimed in claim 30, wherein molding the molding material is followed by gluing the optoelectronic module with a contact on the optoelectronic module to the first contact of the base body by means of an electrically conducting adhesive.

40. The method as claimed in claim 32, wherein the casting of the molding material results in a depression on which the contact area borders.

41. The method as claimed in claim 40, wherein the casting is followed by the optoelectronic module being at least partially arranged within the depression.

42. A system for performing at least one of transmitting and receiving via a fiber, the system comprising:
   a connector module comprising:
      a base body having a first contact, a second contact, and a conductive trace electrically connecting the first and second contacts, at a surface of the base body; and
      a molded part,
      the molded part being cast onto the base body across part of the surface, and the base body and the molded part together defining an opening suitable for introducing a fiber; and
      an optoelectronic module mounted to the connector module to be optically coupled to the fiber in a state of the fiber in which it is introduced into the fiber introduction opening of the connector module.

43. A system for performing at least one of transmitting and receiving via a fiber, the system comprising:
   a connector module comprising:
      a base body having a first contact, a second contact, and a conductive trace electrically connecting the first and second contacts, at a surface of the base body, and a through-opening opening at a first end of same at a contact area of the base body, within which the first contact is formed; and
      a molded part cast onto the base body across part of the surface, so that the conductive trace is at least partly covered by the molded part, and that the base body and the molded part together form a snapping mechanism at a second end, opposite the first end, of the through-opening; and
      an optoelectronic module mounted to the connector module to be optically coupled to the fiber in a state of the fiber in which it is introduced into the fiber introduction opening of the connector module.

44. A method of manufacturing a connector module comprising:
   providing a base body having a first contact for electrically contacting an optoelectronic module, and a second contact for electronically contacting a board, and a conductive trace for electrically connecting the first and second contacts on a surface of the base body; and
   casting a molding material onto the base body across part of the surface, so that at least one of the base body and the molding material define an opening for introducing a fiber,
   wherein the providing and the casting are performed such that the surface of the base body comprises a portion having projecting and recessed parts and the molding material interlocks with the projecting and recessed parts when being cast onto the base body.

* * * * *